(12) United States Patent
Ohara et al.

(10) Patent No.: US 11,937,448 B2
(45) Date of Patent: Mar. 19, 2024

(54) ELECTRONIC DEVICE INCLUDING A PLURALITY OF NITRIDE INSULATING LAYERS

(71) Applicant: Japan Display Inc., Tokyo (JP)

(72) Inventors: Hiroki Ohara, Tokyo (JP); Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/957,929

(22) Filed: Sep. 30, 2022

(65) Prior Publication Data

US 2023/0022872 A1 Jan. 26, 2023

Related U.S. Application Data

(63) Continuation of application No. 17/004,867, filed on Aug. 27, 2020, now Pat. No. 11,462,715.

(30) Foreign Application Priority Data

Aug. 27, 2019 (JP) ................................ 2019-154317

(51) Int. Cl.
*H10K 50/84* (2023.01)
*H10K 50/844* (2023.01)
(Continued)

(52) U.S. Cl.
CPC ..... *H10K 50/844* (2023.02); *G02F 1/133305* (2013.01); *G02F 1/133528* (2013.01);
(Continued)

(58) Field of Classification Search
CPC ............. H10K 50/844; H10K 50/8426; H10K 50/868; H10K 50/86; H10K 50/865; H10K 59/1216; H10K 59/122; H10K 59/124; H10K 59/126; H10K 59/40; H10K 59/12; H10K 2102/00; H10K 2102/311; H10K 2102/351; H01L 27/14678; H01L 29/7869; H01L 29/78693; G02F 1/133305; G02F 1/133528; G06F 1/1641; G06F 1/1652;
(Continued)

(56) References Cited

U.S. PATENT DOCUMENTS 9,048,459 B2 6/2015 Cho et al.
9,252,393 B2 2/2016 Kim
(Continued)

FOREIGN PATENT DOCUMENTS

JP 2008-243379 A 10/2008
KR 20180009845 A * 1/2018 ......... H10K 50/8426

*Primary Examiner* — Ida M Soward
(74) *Attorney, Agent, or Firm* — K&L Gates LLP

(57) ABSTRACT

An electronic device is provided and includes first region including organic layer in light emitting element; nitride layers over organic layer; first organic insulating layer over organic layer; and second region including nitride layers, outside first region, wherein second region does not include organic layer and first organic insulating layer, wherein nitride layers include first, second and third nitride layers, wherein first nitride layer is between organic layer and first organic insulating layer in first region, wherein second and third nitride layers are over first nitride layer, and wherein second nitride layer is in contact with first organic insulating layer in first region.

6 Claims, 15 Drawing Sheets

(51) Int. Cl.
  H10K 50/86 (2023.01)
  H10K 59/12 (2023.01)
  H10K 59/40 (2023.01)
  *G02F 1/1333* (2006.01)
  *G02F 1/1335* (2006.01)
  *G06F 1/16* (2006.01)
  *G09F 9/30* (2006.01)
  *H01L 27/12* (2006.01)
  *H01L 29/786* (2006.01)
  *H10K 50/80* (2023.01)
  *H10K 50/842* (2023.01)
  *H10K 59/121* (2023.01)
  *H10K 59/122* (2023.01)
  *H10K 59/124* (2023.01)
  *H10K 59/126* (2023.01)
  *H10K 102/00* (2023.01)

(52) U.S. Cl.
  CPC .......... *G06F 1/1641* (2013.01); *G06F 1/1652* (2013.01); *G09F 9/301* (2013.01); *G09G 2300/0408* (2013.01); *G09G 2300/0804* (2013.01); *G09G 2380/02* (2013.01); *H01L 27/1248* (2013.01); *H01L 29/7869* (2013.01); *H01L 29/78693* (2013.01); *H10K 50/8426* (2023.02); *H10K 50/865* (2023.02); *H10K 50/868* (2023.02); *H10K 59/1216* (2023.02); *H10K 59/122* (2023.02); *H10K 59/124* (2023.02); *H10K 59/126* (2023.02); *H10K 59/40* (2023.02); *H10K 2102/00* (2023.02); *H10K 2102/311* (2023.02); *H10K 2102/351* (2023.02)

(58) Field of Classification Search
  CPC ............ G09F 9/301; G09G 2300/0408; G09G 2300/0804; G09G 2380/02
  See application file for complete search history.

(56) References Cited

U.S. PATENT DOCUMENTS

| | | | |
|---|---|---|---|
| 9,853,245 | B2 | 12/2017 | Kim et al. |
| 10,021,741 | B2 | 7/2018 | Lee et al. |
| 10,135,028 | B2 | 11/2018 | Kim |
| 10,147,906 | B2 | 12/2018 | Ghosh et al. |
| 10,202,683 | B2 | 2/2019 | Lee et al. |
| 10,431,773 | B2 | 10/2019 | Song et al. |
| 10,811,639 | B2 | 10/2020 | Ivan et al. |
| 10,854,847 | B2 | 12/2020 | Kim et al. |
| 11,018,318 | B2 | 5/2021 | Huang et al. |
| 2003/0064171 | A1 | 4/2003 | Burrows et al. |
| 2012/0235171 | A1 | 9/2012 | Kim et al. |
| 2013/0092972 | A1* | 4/2013 | Kim .................. H10K 50/8445 438/26 |
| 2014/0179041 | A1* | 6/2014 | Huh .................... H10K 50/844 438/28 |
| 2015/0021565 | A1 | 1/2015 | Min et al. |
| 2017/0256740 | A1 | 9/2017 | Xiao et al. |
| 2017/0343713 | A1* | 11/2017 | Lee ...................... G02B 5/3083 |
| 2017/0352837 | A1* | 12/2017 | Yun ..................... H10K 50/844 |
| 2017/0365813 | A1* | 12/2017 | Kamiya ................ G06F 3/0412 |
| 2017/0373270 | A1* | 12/2017 | Kim ...................... H10K 77/111 |
| 2018/0123082 | A1* | 5/2018 | Sasaki .................... H10K 50/84 |
| 2018/0151837 | A1* | 5/2018 | Furuie ................ H10K 50/8426 |
| 2018/0184519 | A1 | 6/2018 | Jia et al. |
| 2018/0233700 | A1 | 8/2018 | Li |
| 2018/0233701 | A1 | 8/2018 | Li et al. |
| 2019/0051708 | A1* | 2/2019 | Jeong ................. H10K 59/1213 |
| 2019/0067634 | A1 | 2/2019 | Wang et al. |
| 2019/0189731 | A1* | 6/2019 | Managaki ............. G06F 3/0443 |
| 2019/0363293 | A1 | 11/2019 | Matsui et al. |
| 2021/0074794 | A1 | 3/2021 | Managaki |
| 2021/0089186 | A1 | 3/2021 | Ma et al. |

* cited by examiner

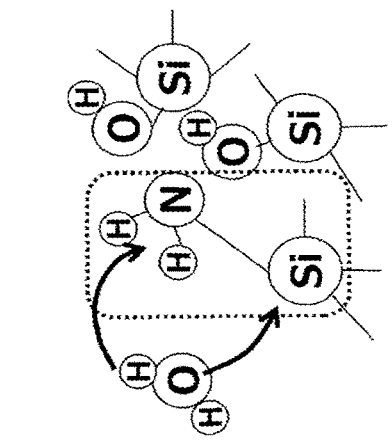
Fig. 4A
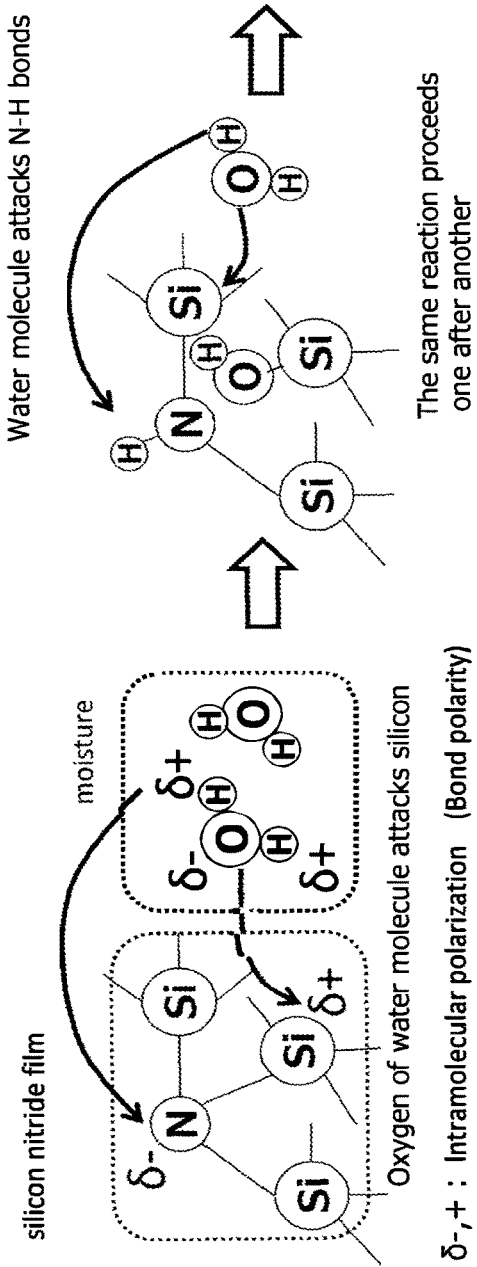
Fig. 4B
Fig. 4C
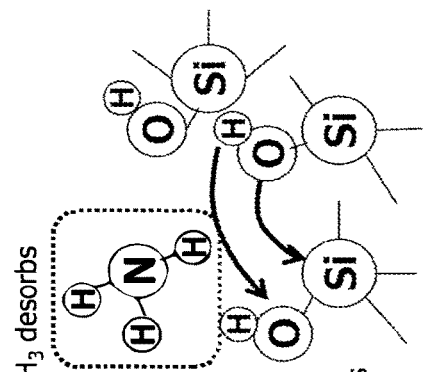
Fig. 4D
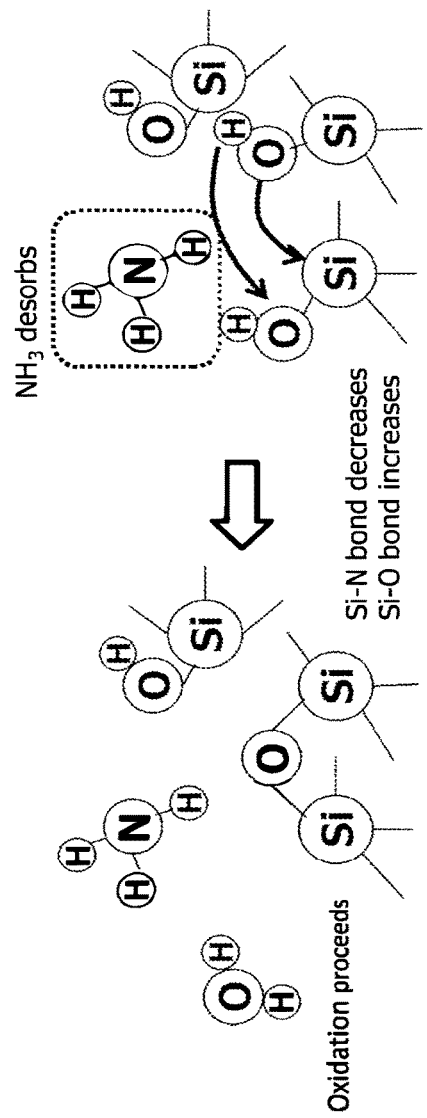
Fig. 4E

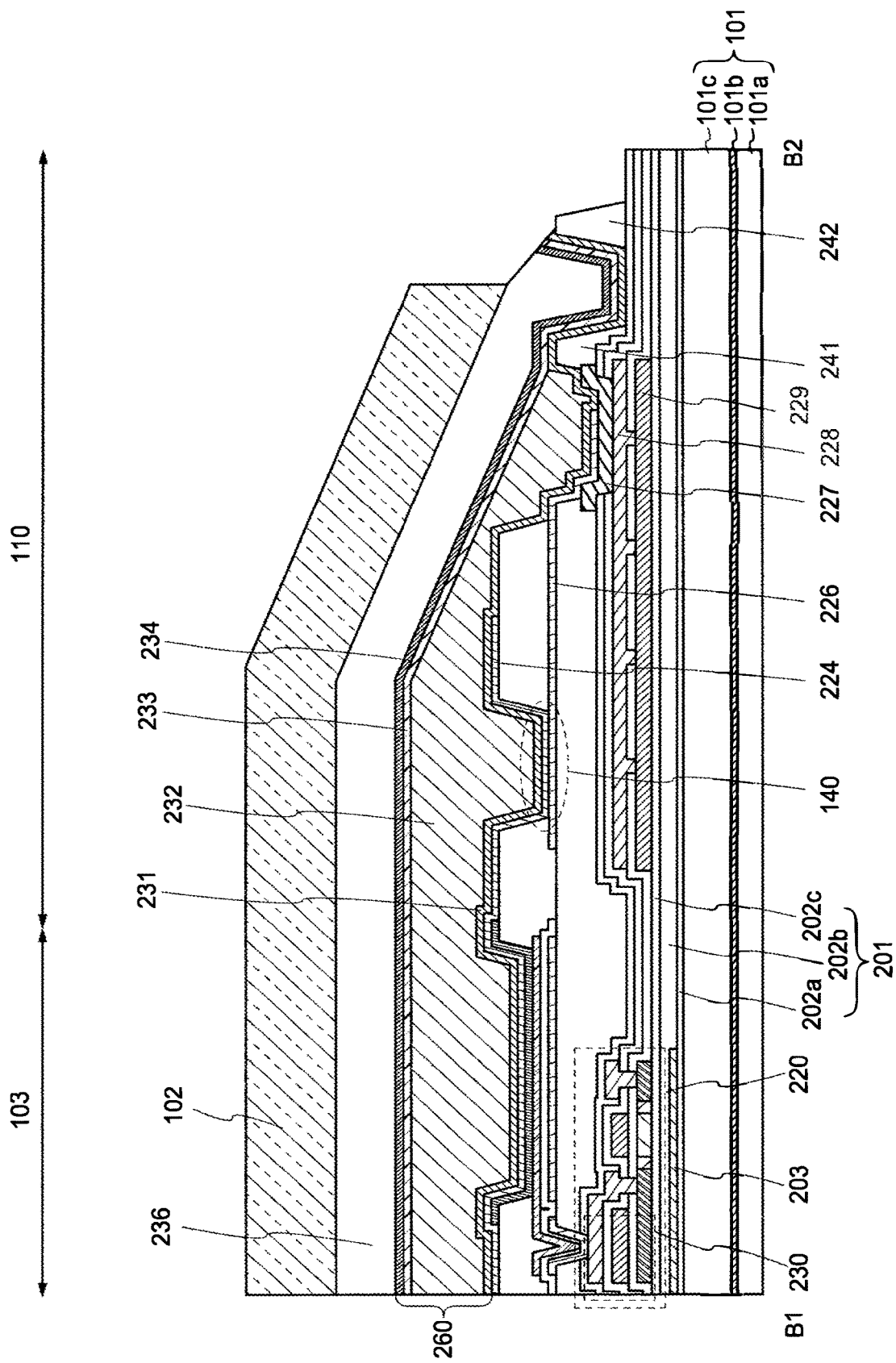

ELECTRONIC DEVICE INCLUDING A PLURALITY OF NITRIDE INSULATING LAYERS

CROSS REFERENCE TO RELATED APPLICATIONS

This application is a continuation of U.S. patent application Ser. No. 17/004,867, filed Aug. 27, 2020, which application is based on and claims the benefit of priority from the prior Japanese Patent Application No. 2019-154317, filed on Aug. 27, 2019, the entire contents of which are incorporated herein by reference.

FIELD

One embodiment of the present invention is related to a display device and a manufacturing method thereof.

BACKGROUND

Conventionally, an organic EL display device using an organic electroluminescence material (hereinafter, referred to as "organic EL material") in a light emitting element (hereinafter, referred to as "organic EL element") of a display region has been known as a display device. The organic EL display device is a so-called self-light emitting type display device which realizes a display by causing an organic EL material to emit light.

A light emitting element included in a display region deteriorates due to moisture. Therefore, in the organic EL display device, the deterioration of the light emitting element is suppressed by providing a sealing film over the light emitting element in order to prevent the entrance of moisture to the light emitting element. For example, Japanese Laid-Open Patent Publication No. 2008-243379 discloses a display device in which a first sealing film and a second sealing film consisting of inorganic materials such as silicon nitride or silicon oxide are provided on a light emitting element. Further, Japanese Laid-Open Patent Publication No. 2005-504652 discloses a structure in which an end portion of a polymer is covered with an inorganic material.

SUMMARY

A display device according to an embodiment of the present invention includes a first region including a light emitting layer, a first nitride insulating layer over the light emitting layer, a first organic insulating layer over the first nitride insulating layer, a second nitride insulating layer over the first organic insulating layer, and a third nitride insulating layer over the second nitride insulating layer. The second nitride insulating layer is in contact with the first organic insulating layer and the third nitride insulating layer. An absolute value of a stress of the second nitride insulating layer is greater than or equal to an absolute value of a stress of the first nitride insulating layer and less than an absolute value of a stress of the third nitride insulating layer.

Further, a display device according to an embodiment of the present invention includes a first region including a light emitting layer, a first nitride insulating layer over the light emitting layer, a first organic insulating layer over the first nitride insulating layer, a second nitride insulating layer over the first organic insulating layer, and a third nitride insulating layer over the second nitride insulating layer. The second nitride insulating layer is in contact with the first organic insulating layer and the third nitride insulating layer. In a wet etching, an etching rate of the second nitride insulating layer is greater than or equal to an etching rate of the first nitride insulating layer and less than or equal to an etching rate of the third nitride insulating layer.

Furthermore, a display device in one embodiment according to the present invention includes a first region including a light emitting layer, a first nitride insulating layer over the light emitting layer, a first organic insulating layer over the first nitride insulating layer, a second nitride insulating layer over the first organic insulating layer, and a third nitride insulating layer over the second nitride insulating layer. The second nitride insulating layer is in contact with the first organic insulating layer and the third nitride insulating layer. An N—H bond ratio of the second nitride insulating layer is greater than an N—H bond ratio of the first nitride insulating layer and less than or equal to an N—H bond ratio of the third nitride insulating layer.

BRIEF DESCRIPTION OF DRAWINGS

FIG. 4A is a diagram illustrating a mechanism for desorbing $NH_3$ from a film including nitrogen;

FIG. 4B is a diagram illustrating a mechanism for desorbing $NH_3$ from a film including nitrogen;

FIG. 4C is a diagram illustrating a mechanism for desorbing $NH_3$ from a film including nitrogen;

FIG. 4D is a diagram illustrating a mechanism for desorbing $NH_3$ from a film including nitrogen;

FIG. 4E is a diagram illustrating a mechanism for desorbing $NH_3$ from a film including nitrogen;

FIG. 7 is a cross-sectional view taken along a line B1-B2 of a display device according to an embodiment of the present invention;

DESCRIPTION OF EMBODIMENTS

Figure 1:
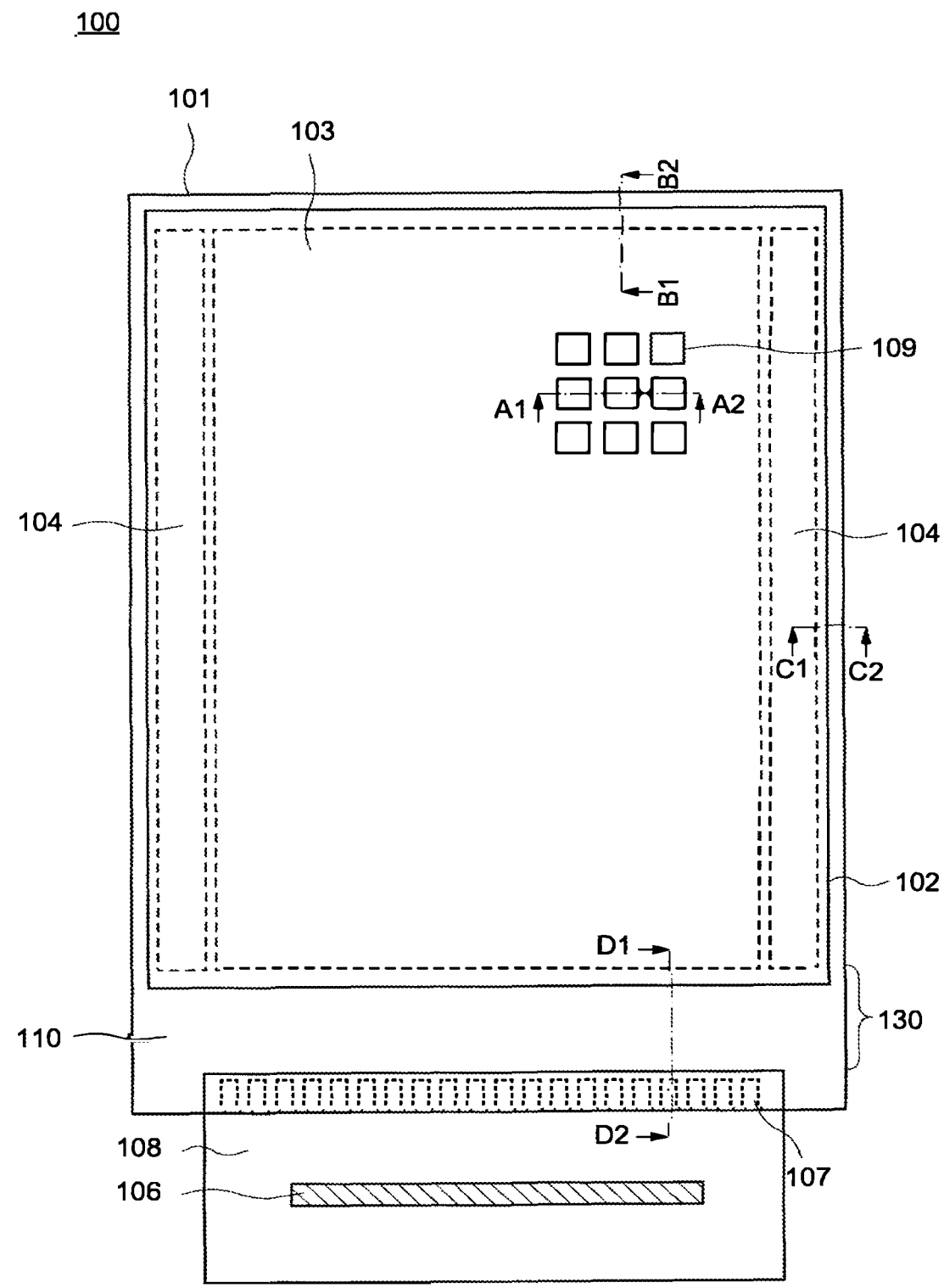
FIG. 1 is a schematic view illustrating a structure of a display device according to an embodiment of the present invention.

A nitride layer (a nitride insulating layer) included in a sealing film over a light emitting element generates ammonium ions by hydrolysis. That is, if moisture is not sufficiently removed in the light emitting element, the moisture moves to the sealing film, and ammonium ions are generated from the nitride insulating layer. When the ammonium ions reach a polarizing plate, the ammonium ions react with the iodine complex contained in the polarizing plate. This reaction causes a defect of the polarizing plate called so-called color loss.

One of the objects of the present invention is to suppress generation of ammonium ions in a nitride insulating layer included in a sealing film of a display device. Further, one of the objects of the present invention is to improve reliability of a light emitting element of a display device. Furthermore, one of the objects of the present invention is to prevent a defective polarizing plate.

Each embodiment of the present invention is explained below while referring to the drawings. However, the present invention can be implemented in various modes without departing from the gist of the invention and should not to be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In addition, in the drawings, the same reference numerals are provided to the same elements as those described above with reference to preceding figures and repeated explanations may be omitted accordingly.

In the case when a single film is processed to form a plurality of structural bodies, each structural body may have different functions and roles, and the bases formed beneath each structural body may also be different. However, the plurality of structural bodies is derived from films formed in the same layer by the same process and have the same material. Therefore, the plurality of these films is defined as existing in the same layer.

When expressing a mode in which another structure is arranged above a certain structure, in the case where it is simply described as "over", unless otherwise noted, a case where another structure is arranged directly above a certain structure as if in contact with that structure, and a case where another structure is arranged via another structure above a certain structure, are both included.

The expression "a certain structure is exposed from another structure" means a certain structure includes a region which is not covered with another structure. However, the region which is not covered with another structure may be covered with yet another structure.

In the specification, "nitride" includes not only nitride but also oxynitride.

In the specification, "a water vapor permeability" means the number of grams of water vapor per 1 m$^2$ permeated in 24 hours.

In the specification, "a wet etching rate" means an etching rate when wet etching is performed using 1% buffered hydrofluoric acid.

In the specification, "an N—H bond ratio" means a ratio of N—H bond among a plurality of bond types measured by an FT-IR analysis.

First Embodiment

Referring to FIG. 1 to FIG. 10, an example of a structure of a display device 100 according to an embodiment of the present invention is described.

[Structure of Display Device]

FIG. 1 is a planar view of the display device 100 according to an embodiment of the present invention. In the display device 100, a first region 103 and a second region 110 outside the first region 103 are provided over a substrate 101.

The first region 103 is a so-called display region. A plurality of pixels 109 is arranged in a matrix in the first region 103. The plurality of the pixels 109 is not limited to the arrangement in the matrix. For example, the pixels 109 can be arranged in a staggered pattern.

The second region 110 is a so-called periphery region. The second region 110 includes two scanning line drive circuits 104 provided along a longitudinal direction (a long side direction) of the first region 103, a plurality of terminals 107 provided at an end portion of the substrate 101 along a lateral direction (a short side direction) of the first region 103, and a bent region 130 provided between the first region 103 and the plurality of terminals 107. The two scanning line drive circuits 104 are provided with the first region 103 interposed therebetween. The plurality of terminals 107 are connected to a flexible printed circuit board 108. A driver IC 106 is provided on the flexible printed circuit board 108. The bent region 130 is a region where the substrate 101 is bent. A frame of the display device 100 can be narrowed by bending the bent region 130 so that the plurality of terminals 107 overlaps with a back surface of the first region 103 (a back surface of the substrate 101).

An image signal and various control signals are supplied from a controller (not shown in the diagram) external to the display device 100 through the flexible printed circuit board 108. The image signal is processed by the driver IC 106 and is input to the plurality of pixels 109. The various control signals are input to the scanning line drive circuit 104 through the driver IC 106.

In addition to the image signal and the various control signals, power for driving the scanning line drive circuit 104, the driver IC 106, and the plurality of pixels 109 is supplied to the display device 100. Each of the plurality of pixels 109 includes a light emitting element 240 which is described later. Part of the power which is supplied to the display device 100 is supplied to the light emitting element 240 included in each of the plurality of pixels 109 and the light emitting element 240 can emit light.

In the display device 100, a polarizing plate 102 is also provided so as to overlap with the first region 103 and the scan line drive circuits 104.

[Pixel Circuit]

Figure 2:
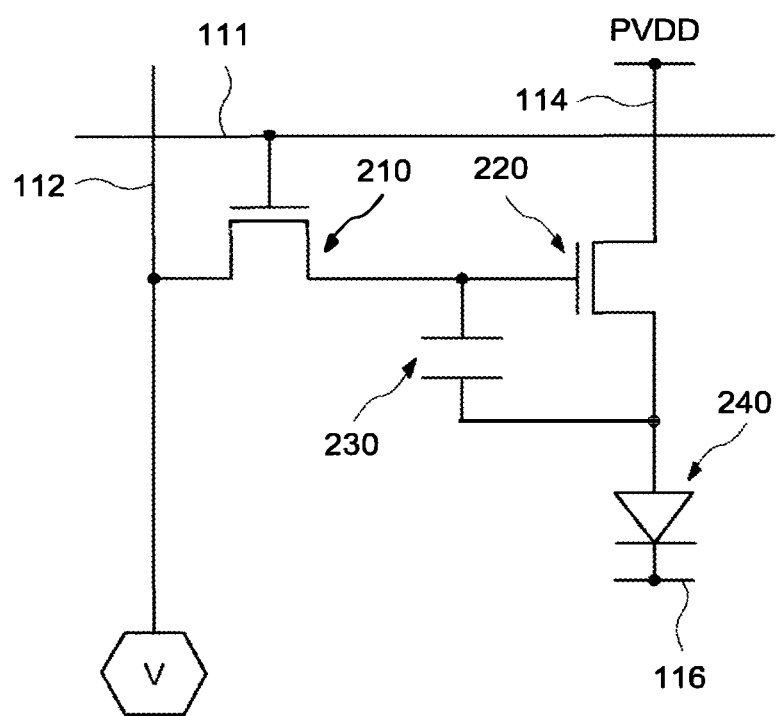
FIG. 2 is a circuit diagram of a pixel in a display device according to an embodiment of the present invention.

FIG. 2 is a pixel circuit included in each of the plurality of pixels 109 arranged in the display device 100 according to an embodiment of the present invention. The pixel circuit includes at least a transistor 210, a transistor 220, a capacitor 230, and a light emitting element 240.

The transistor 210 functions as a selection transistor. That is, a conduction state of the transistor 210 is controlled by a scanning line 111 which is connected to a gate of the transistor 210. The gate, a source, and a drain of the transistor 210 are electrically connected to the scanning line 111, a signal line 112, and a gate of the transistor 220, respectively.

The transistor 220 functions as a drive transistor. That is, the transistor controls light emission luminance of the light emitting element 240. A gate, a source, and a drain of the transistor 220 are electrically connected to a source of the transistor 210, a drive power supply line 114, and an anode of the light emitting element 240.

One capacitor electrode of the capacitor 230 is electrically connected to the gate of the transistor 220 and the drain of the transistor 210. In addition, the other capacitor electrode of the capacitor 230 is electrically connected to the anode of the light emitting element 240 and the drain of the transistor 220.

The anode of the light emitting element 240 is electrically connected to the drain of the transistor 220 and a cathode of the light emitting element 240 is connected to the reference power line 116.

[Structure of First Region]

Figure 3:
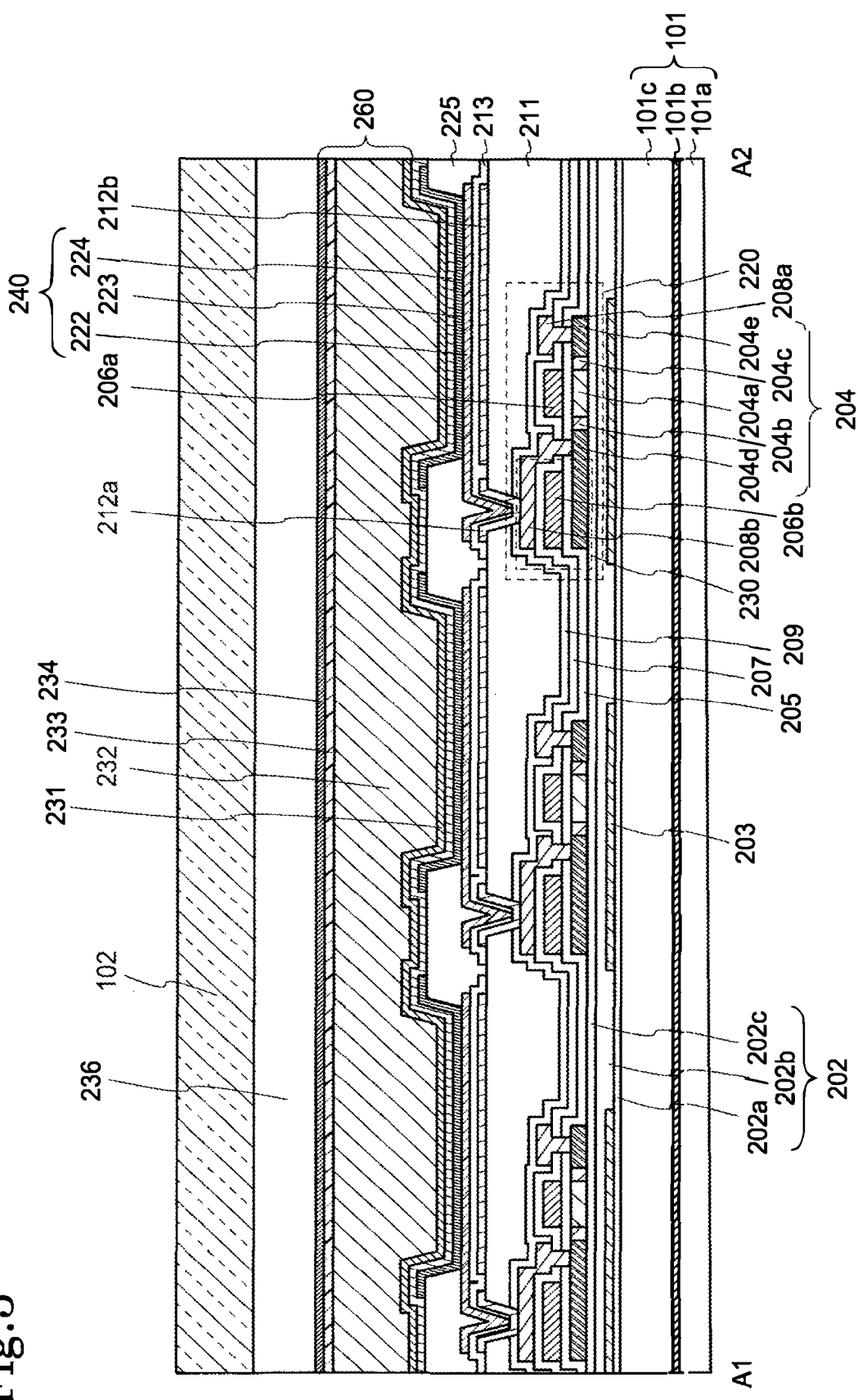
FIG. 3 is a cross-sectional view of a pixel in a display device according to an embodiment of the present invention.

FIG. 3 is a cross-sectional view of the pixel 109 in the display device 100 according to an embodiment of the present invention. Specifically, FIG. 3 is the cross-sectional view of the display device 100 taken along an A1-A2 line as shown in FIG. 1.

The substrate 101 has a stacked structure including a first resin layer 101a, an inorganic layer 101b, and a second resin layer 101c. It is preferable to provide the inorganic layer 101b between the first resin layer 101a and the second resin layer 101c in order to improve adhesion between the first resin layer 101a and the second resin layer 101c. For example, acrylic, polyimide, polyethylene terephthalate, polyethylene naphthalate, or the like can be used as a material of the first resin layer 101a and the second resin layer 101c. In addition, for example, silicon nitride, silicon oxide, or amorphous silicon is used as a material of the inorganic layer 101b.

An undercoat layer 202 is provided over the substrate 101. The undercoat layer 202 is provided, for example, as a single layer or a stacked layer of a silicon oxide layer and a silicon nitride layer. In this embodiment, the undercoat layer 202 has a stacked structure including three layers of a silicon oxide layer 202a, a silicon nitride layer 202b, and a silicon oxide layer 202c. The silicon oxide layer 202a can improve adhesion to the substrate 101. The silicon nitride layer 202b can function as a blocking film for external moisture and impurities. The silicon oxide layer 202c can functions as a blocking film that prevents hydrogen contained in the silicon nitride layer 202b from diffusing to a semiconductor layer, which is described later.

In addition, the light-blocking layer 203 can be provided in the undercoat layer 202 in accordance with a portion where the transistor 220 is provided. By providing the light-blocking layer 203, changes in transistor characteristics due to entrance of light to the back surface of a channel of the transistor 220 or the like can be suppressed. Further, by forming the light-blocking layer 203 as a conductive layer and applying a predetermined potential to the light-blocking layer 203, the transistor 220 can have a back gate effect. That is, the silicon oxide layer 202a, the light-blocking layer 203, the silicon nitride layer 202b, and the silicon oxide layer 202c are provided as the undercoat layer 202.

The transistor 220 is provided over the undercoat 202. The transistor 220 includes a semiconductor layer 204, a gate insulating film 205, and a gate electrode 206a. Although an example in which an n-channel transistor is used as the transistor 220 is shown, a p-channel transistor may also be used as the transistor 220. In this embodiment, the re-channel transistor has a structure in which low concentration impurity regions 204b and 204c are provided between a channel region 204a and a source region 204d and a drain region 204e (high concentration impurity regions). Amorphous silicon, polysilicon, or oxide semiconductor such as IGZO can be used as a material of the semiconductor layer 204. Further, for example, the gate insulating layer 205 can have a single layer or a stacked layer. For example, molybdenum tungsten (MoW) can be used as a material of the gate electrode 206e. Furthermore, although the structure of the transistor 220 is shown in FIG. 3, the structure of the transistor 210 is similar to the structure of the transistor 220.

An interlayer insulating layer 207 is provided to cover the gate electrode 206a. For example, silicon oxide or silicon nitride can be used as a material of the interlayer insulating layer 207. In addition, the interlayer insulating layer 207 can have a single layer or a stacked layer. A source electrode 208a or a drain electrode 208b is provided over the interlayer insulating layer 207. The source electrode 208a and the drain electrode 208b are electrically connected to the source region 204d and the drain region 204e of the semiconductor layer 204, respectively, via opening portions in the interlayer insulating layer 207 and the gate insulating layer 205.

Here, a conductive layer 206b is provided over the gate insulating layer 205. The conductive layer 206b is formed in the same process as the gate electrode 206a. One capacitor is formed with the gate insulating layer 205 interposed between the conductive layer 206b and the source region 204d or the drain region 204e of the semiconductor layer 204. In addition, the other capacitor is formed with the interlayer insulating layer 207 interposed between the conductive layer 206b and the source electrode 208a or the drain electrode 208b.

An insulating layer 209 is provided over the source electrode 208a or the drain electrode 208b.

A planarization film 211 is provided over the insulating layer 209. An organic material such as photosensitive acrylic or polyimide can be used for the planarization film 211. By providing the planarization film 211, a step due to the structure of the transistor 220 can be planarized.

Transparent conductive films 212a and 212b are provided over the planarization film 211. The transparent conductive film 212a is electrically connected to the source electrode 208a or the drain electrode 208b through an opening portion provided in the planarization film 211 and the insulating layer 209.

An insulating layer 213 is provided over the transparent conductive films 212a and 212b. In the insulating layer 213, an opening portion is provided between a region where the transparent conductive film 212a and the source electrode 208a or the drain electrode 208b overlap each other and a region which is between the transparent conductive film 212a and the transparent conductive film 212b of the adjacent pixel.

A pixel electrode 222 is provided over the insulating layer 213. The pixel electrode 222 is electrically connected to the transparent conductive film 212a through the opening portion of the insulating layer 213. In this embodiment, the pixel electrode 222 is formed as a reflective electrode and has a stacked structure including three layers of IZO, Ag, and IZO.

An insulating layer 225 which functions as a partition wall is provided at a boundary between the pixel electrode 222 and the pixel electrode 222 of the adjacent pixel. The insulating layer 225 is also called a bank or a rib. An organic material similar to the material of the planarization film 211 is used as a material of the insulating layer 225. The insulating layer 225 has an opening portion that exposes a part of the pixel electrode 222. It is preferable that a side surface of the opening portion has a gentle taper shape. When the side surface of the opening portion has a steep taper shape, coverage failure occurs in the organic layer 223 formed over the insulating layer 225.

Here, the planarization film 211 and the insulating layer 225 are in contact with each other at an opening portion provided in the insulating layer 225. With such a structure, moisture and gas which are released from the planarization film 211 at the time of heat treatment for forming the insulating layer 225 can be removed from the insulating layer 225 through the opening portion. Accordingly, peeling at an interface between the planarization film 211 and the insulating layer 225 can be suppressed.

After the formation of the insulating layer 225, an organic layer 223 included in an organic EL layer is formed. The organic layer 223 includes at least a hole transport layer, a light emitting layer, and an electron transport layer, which are stacked in this order over the electrode 222. Although the organic layer 223 is selectively provided for each pixel 109 in FIG. 3, the light emitting layer of the organic layer 223 may be selectively provided for each pixel 109, and the hole transport layer and the electron transport layer may be provided so as to cover all pixels 109. These layers may be formed by a vapor deposition or a coating using a solution containing a solvent. Further, not only the hole transport layer and the electron transport layer, but also the light emitting layer may be provided so as to cover all the pixels 109. When the light emitting layer is provided so as to cover all the pixels 109, white light can be obtained from all the pixels 109, and the display device 100 can be configured to extract a desired color wavelength part through a color filter (not shown in FIG. 3).

After the formation of the organic layer 223, a counter electrode 224 is formed. In this embodiment, since the organic EL layer has a top emission structure, the counter electrode 224 needs to have light transmissivity. Here, the top emission structure means a structure where light is emitted from the counter electrode 224 arranged over the pixel electrode 222 with the organic layer 223 interposed therebetween. In this embodiment, an MgAg thin film that allows light emitted from the organic EL layer to pass through is formed as the counter electrode 224. According to the order of the formation of the organic layer 223 described above, the pixel electrode 222 serves an anode and the counter electrode 224 serves a cathode.

A sealing film 260 is provided over the counter electrode 224 of the light emitting element 240. The sealing film 260 has a function of preventing external moisture from entering the organic layer 223 and is required to have a high gas barrier property. As an example of a film having such a function, a layer containing nitrogen (hereinafter, referred to as "a nitride insulating layer") can be given. However, there is a problem that moisture entering from the outside or moisture contained in the organic resin reacts with the nitride insulating layer to generate ammonium ions.

[Mechanism of Generating Ammonium Ions]

Here, in the case where a silicon nitride layer is used as the nitride insulating layer, FIG. 4A to FIG. 4E show the mechanism in which moisture entering from the outside or moisture contained in the organic resin reacts with the silicon nitride layer to generate ammonium ions. In addition, when an acid is generated by using a photo-acid generator (a photo-cationic polymerization initiator) during the curing of the organic resin, the acid also promotes the generation of ammonium ions.

As shown in FIG. 4A, oxygen in moisture contained in the second organic insulating layer 236 or moisture entering from the outside attacks silicon of the silicon nitride layer. Then, as shown in FIG. 4B, the moisture attacks not only the silicon of the silicon nitride layer but also an N—H bond. As the reaction proceeds, intermediate product ≡Si—N—H$_2$ increases as shown in FIG. 4C. As the reaction further proceeds, NH$_3$ (ammonium ion) is desorbed from the silicon nitride layer as shown in FIG. 4D. Finally, Si—N bonds decrease and Si—O bonds increase. That is, as shown in FIG. 4E, the silicon nitride layer is oxidized by the moisture.

When ammonium ions desorbed from the silicon nitride layer reach a polarizing plate 102, the ammonium ions attack an iodine complex in the polarizing plate 102. As a result, the polarizing plate 102 is discolored in white, and a defect of the polarizing plate 102 which is called a so-called color loss occurs.

Therefore, it is necessary to suppress the generation of the ammonium ions in the sealing film 260 in order to not only improve the reliability of the light emitting element 240 but also prevent the defect of the polarizing plate 102. As described above, the generation of the ammonium ions is caused by the moisture entering the silicon nitride layer. Therefore, a nitride having a low water vapor permeability and a low N—H bond ratio can be used as a material of the nitride insulating layer included in the sealing film 260. Also, an interface between the nitride insulating layer and the organic insulating layer can be considered as a path for moisture to enter from the outside. Therefore, in the sealing film 260, it is also important to improve an adhesion between the nitride insulating layer and the organic insulating layer.

[Structure of Sealing Film]

In the display device 100 according to an embodiment of the present invention, the sealing film 260 has a stacked structure of a first nitride insulating layer 231, a first organic insulating layer 232, a second nitride insulating layer 233, and a third nitride insulating layer 234.

For example, silicon nitride, aluminum nitride, or the like can be used as materials of the first nitride insulating layer 231, the second nitride insulating layer 233, and the third nitride insulating layer 234. The first nitride insulating layer 231 and the second nitride insulating layer 233 may be the same material. A film thickness of the first nitride insulating layer 231 is, for example, 750 nm or more and 1250 nm or less. A total film thickness of the second nitride insulating layer 233 and the third nitride insulating layer 234 is, for example, 750 nm or more and 1250 nm or less. When the water vapor permeability of the first nitride insulating layer 231 is large, the film thickness of the first nitride insulating layer 231 can be small. On the other hand, when the water vapor permeability of the first nitride insulating layer 231 is small, the film thickness of the first nitride insulating layer 231 can be large. The second nitride insulating layer 233 and the third nitride insulating layer 234 are similar to the first nitride insulating layer 231. The film thickness of the third nitride insulating layer 234 may be the same as the film thickness of the second nitride insulating layer 233. Further, it is preferable that the film thickness of the third nitride insulating layer 234 is greater than the film thickness of the second nitride insulating layer 233. Since the second nitride insulating layer 233 is provided for improving adhesion to the first organic insulating layer 232, the film thickness of the second nitride insulating layer 233 can be small. On the other hand, since the third nitride insulating layer 233 prevent the entry of moisture, the third nitride insulating layer 233 can be preferably provided with the large film thickness. For, example, a ratio of the film thickness of the second nitride insulating layer 233 to the film thickness of the third nitride insulating layer 234 can be 0.11 or more and 1.0 or less.

For example, acrylic resin, epoxy resin, polyimide resin, silicone resin, fluororesin, siloxane resin, or the like can be used as a material of the first organic insulating layer 232. A film thickness of the first organic insulating layer 232 is, for example, 5 μm or more and 15 μm or less.

Each of the first nitride insulating layer 231 and the second nitride insulating layer 233 is in contact with the first organic insulating layer 232 to form an interface. Since the interface can be an entry path of the moisture, it is preferable that the adhesion of the first nitride insulating layer 231 or the second nitride insulating layer 233 to the first organic insulating layer 232 has good. In order to improve the adhesion to the first organic insulating layer 232, it is necessary to adjust a stress of the nitride insulating layer in contact with the first organic insulating layer 232. Specifically, each of the first nitride insulating layer 231 and the second nitride insulating layer 233 is preferably a film having a low stress.

However, the film having the low stress has a small film density and is likely to cause to form pinholes. Therefore, in order to prevent the external moisture, the third nitride insulating layer 234 over the second nitride insulating layer 233 is preferably a film having a high film density. Compared in terms of a stress, it is preferable that an absolute value of the stress of the second nitride insulating layer 233 is greater than or equal to an absolute value of the stress of the first nitride insulating layer 231 and is less than the absolute value of the stress of the third nitride insulating layer 234. Is preferred.

When the stress of the nitride insulating layer cannot be measured, the nitride insulating layer can be compared using a film density. The nitride insulating layer having a high film density also has a large stress. Therefore, compared in terms of a film density, it is preferable that a film density of the second nitride insulating layer 233 is less than or equal to a film density of the first nitride insulating layer 231 and is less than a film density of the third nitride insulating layer 234. For example, a silicon nitride layer having a film density of 2.0 ($g/cm^3$) or less can be formed as the first nitride insulating layer 231 and the second nitride insulating layer 233, and a silicon nitride layer having a film density of 2.0 ($g/cm^3$) or more can be formed as the third nitride insulating layer 234.

In addition, the third nitride insulating layer 234 is preferably a film having a low water vapor permeability in order to prevent the moisture from entering from the outside. The second nitride insulating layer 233 as well as the third nitride insulating layer 234 is also preferably a film having a low water vapor permeability in order to prevent the moisture. Therefore, compared in terms of a water vapor permeability, it is preferable that a water vapor permeability of the second nitride insulating layer 233 is greater than a water vapor permeability of the third nitride insulating layer 234 and is less than or equal to a water vapor permeability of the first nitride insulating layer 231.

Even if the water vapor permeability of the nitride insulating layer cannot be measured, the nitride insulating layer can be compared using a wet etching rate. The nitride insulating layer having a high water vapor permeability also has a high wet etching rate. Therefore, compared in terms of a wet etching rate, it is preferable that a wet etching rate of the second nitride insulating layer 233 is greater than a wet etching rate of the third nitride insulating layer 234 and is less than or equal to a wet etching rate of the first nitride insulating layer 231.

Further, since the third nitride insulating layer 234 prevents the moisture from entering from the outside, the third nitride insulating layer 243 is likely to contact with more the moisture than the first nitride insulating layer 231 and the second nitride insulating layer 233. Therefore, the third nitride insulating layer 234 is preferably a film having a low N—H bond ratio. Compared in terms of an N—H bond ratio, an N—H bond ratio of the second nitride insulating layer 233 is greater than an N—H bond ratio of the third nitride insulating layer 234 and is less than or equal to an N—H bond ratio of the first nitride insulating layer 231.

By providing the sealing film 260 to which the above-described first nitride insulating layer 231, second nitride insulating layer 233, and third nitride insulating layer 234 are applied over the light emitting element 240, the external moisture can be prevented from entering the light emitting element 240 and ammonium ions can be suppressed to be generated in the nitride insulating layer. Therefore, the sealing film 260 can improve the reliability of the light emitting element 240 and prevent the defect of the polarizing plate 102.

In the following, a structure over the sealing film 260 is described.

A second organic insulating layer 236 is provided over the sealing film 260 so as to cover the first region 103. The second organic insulating layer 236 can function as a mask for etching the first nitride insulating layer 231, the second nitride insulating layer 233, and the third nitride insulating layer 234. For example, an adhesive material such as an acrylic resin, a rubber resin, a silicone resin, or a urethane resin can be used for the second organic insulating layer 236. A film thickness of the second organic insulating layer 236 is, for example, 5 μm or more and 25 μm or less.

A polarizing plate 102 is provided over the second organic insulating layer 236. The polarizing plate 102 has a stacked structure including a quarter-wave plate and a linear polarizing plate. With this configuration, light from the light emitting region can be emitted to the outside from the surface of the polarizing plate 102 on the display side. Here, a thickness of the polarizing plate 102 is 100 μm or more and 200 μm or less.

In the display device 100, a cover glass over the polarizing plate 102 may be provided, if necessary. A touch sensor or the like may be formed on the cover glass. In this case, a filler including a resin or the like may be filled in a gap between the polarizing plate 102 and the cover glass.

As described above, in the display device 100 according to an embodiment of the present invention, the sealing film 260 includes the first nitride insulating layer 231 below the first organic insulating layer 232, and the second nitride insulating layer 233 and the third nitride insulating layer 234 over the first organic insulating layer 232. By including the first nitride insulating layer 231, the second nitride insulating layer 233, and the third nitride insulating layer 234, the adhesion at the interface of the first organic insulating layer 232 can be improved and the moisture can be prevented from entering the light emitting element 240. In addition, the generation of the ammonium ions in the first nitride insulating layer 231, the second nitride insulating layer 233, and the third nitride insulating layer 234 can also be suppressed. As a result, the reliability of the light emitting element 240 is improved and defects of the polarizing plate 102 are prevented, so that the display device 100 becomes a highly durable display device.

[Modification of Structure of Sealing Film]

Figure 5:
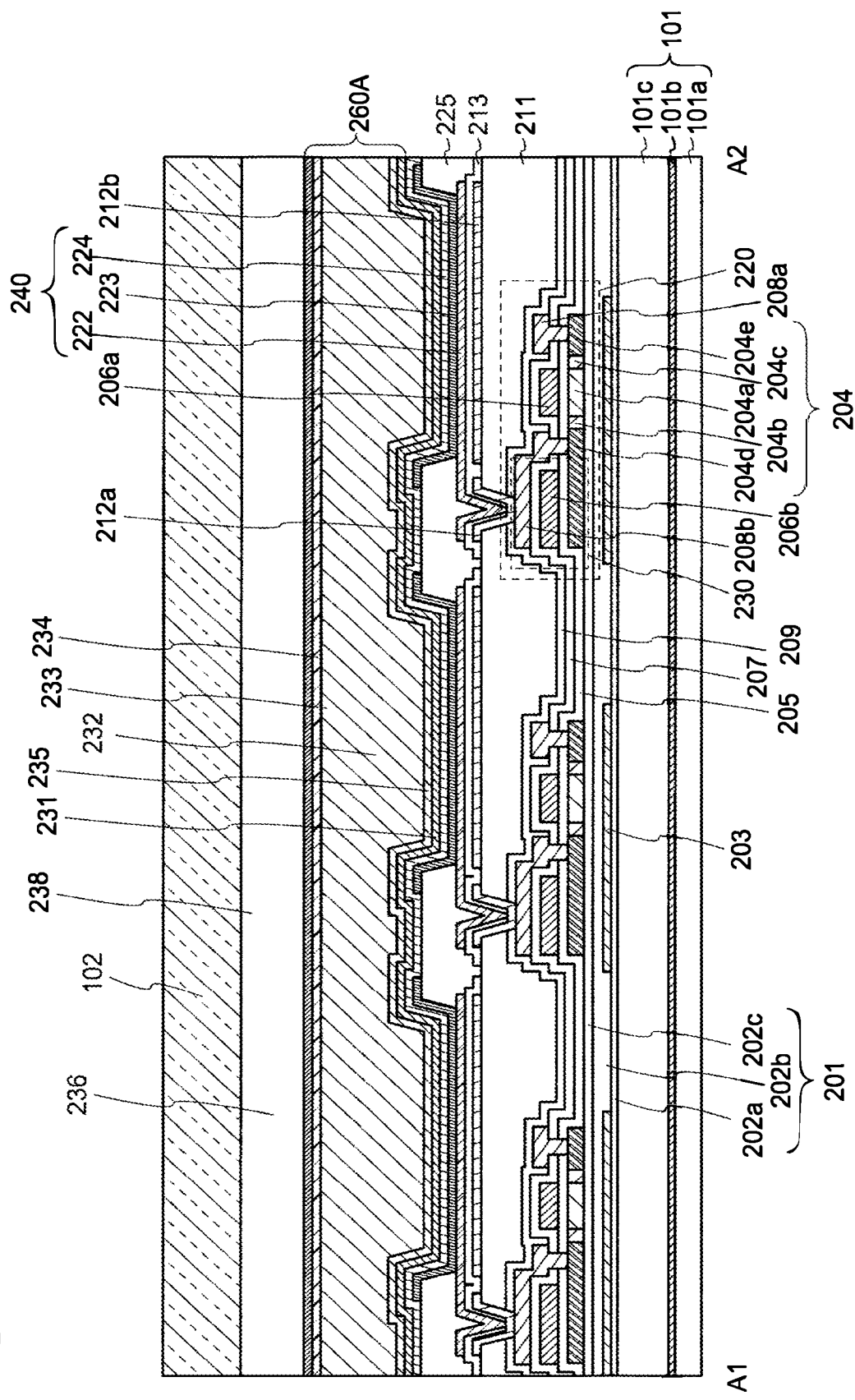
FIG. 5 is a cross-sectional view of a pixel in a display device according to an embodiment of the present invention.

Referring to FIG. 5, a modification of the display device 100 according to an embodiment of the present invention is described. FIG. 5 is a cross-sectional view of the pixel 109 in the display device 100 according to an embodiment of the present invention. In FIG. 5, the structure of the sealing film 260 as shown in FIG. 3 is modified into a sealing film 260A.

The sealing film 260A has a stacked structure of the first nitride insulating layer 231, a fourth nitride insulating layer 235, the first organic insulating layer 232, the second nitride insulating layer 233, and the third nitride insulating layer 234. That is, the fourth nitride insulating layer 235 is provided between the first nitride insulating layer 231 and the first organic insulating layer 232.

For example, silicon nitride, aluminum nitride, or the like can be used as a material of the fourth nitride insulating layer 235. In addition, silicon nitride, aluminum, or the like containing more oxygen than the material of the first nitride insulating layer 231, the second nitride insulating layer 233, or the third nitride insulating layer 234 can also be used. In other words, oxygen-added silicon nitride, aluminum nitride, or the like can be used as the material of the fourth nitride insulating layer 235. By increasing an amount of oxygen contained in the fourth nitride insulating layer 235 that is in contact with the first organic insulating layer 232, the adhesion to the first organic insulating layer 232 can be further improved. When the fourth nitride insulating layer 235 is provided, a total film thickness of the first nitride insulating layer 231 and the fourth nitride insulating layer 235 is, for example, 750 nm or more and 1250 nm or less.

As described above, in the modification of the display device 100 according to an embodiment of the present invention, the sealing film 260A includes the first nitride insulating 231 and the fourth nitride insulating 235 below the first organic insulating layer 232, and the second nitride insulating layer 233 and the third nitride insulating layer 234 over the first organic insulating layer 232. By further including the fourth nitride insulating layer, the adhesion at the interface of the first organic insulating layer 232 can be further improved and the moisture can be prevented from entering the light emitting element 240. Therefore, the display device 100 becomes a further highly durable display device.

[Manufacturing Method of Display Device]

Figure 6A:
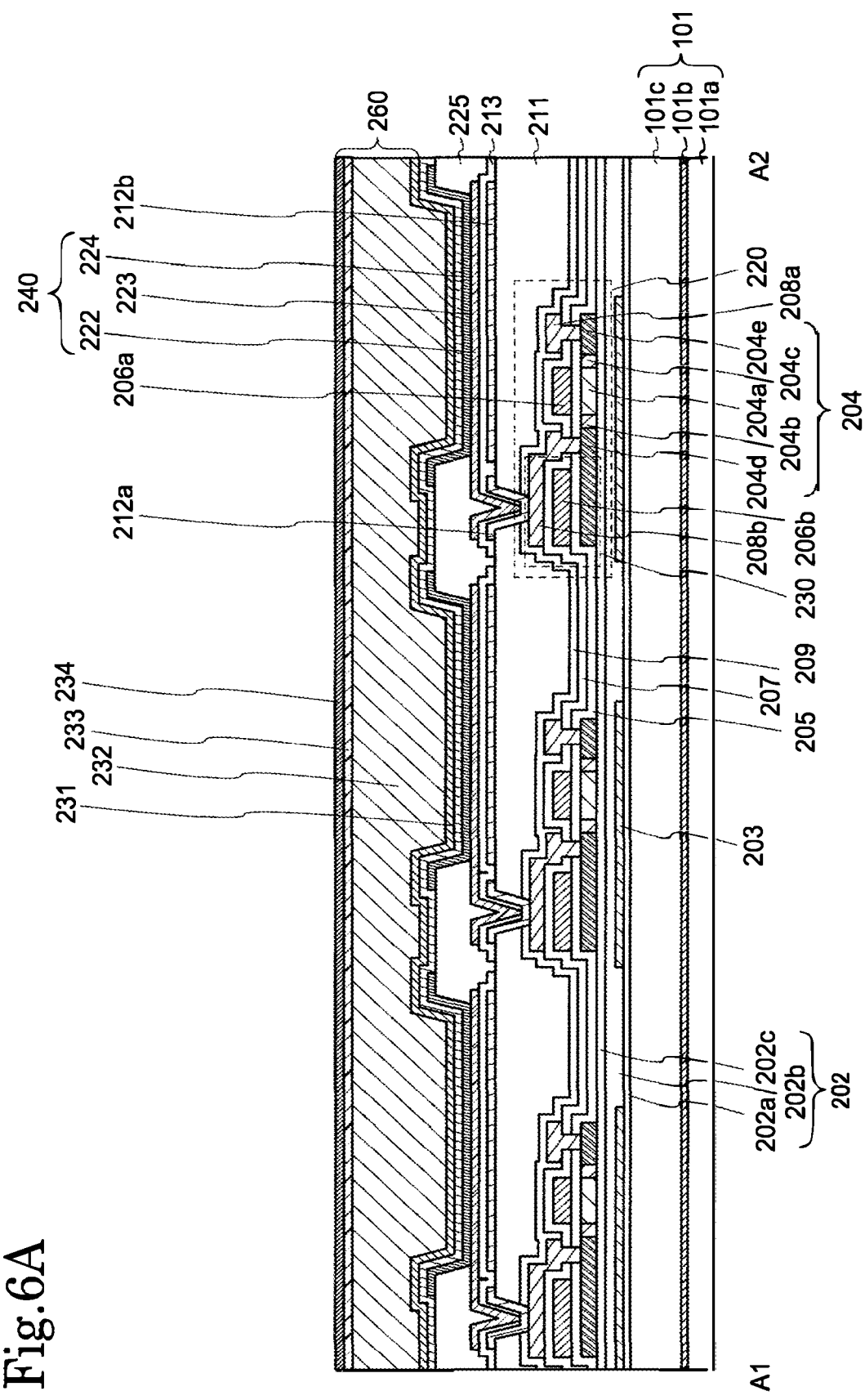
FIG. 6A is a cross-sectional view illustrating a manufacturing method of a display device according to an embodiment of the present invention.
Figure 6B:
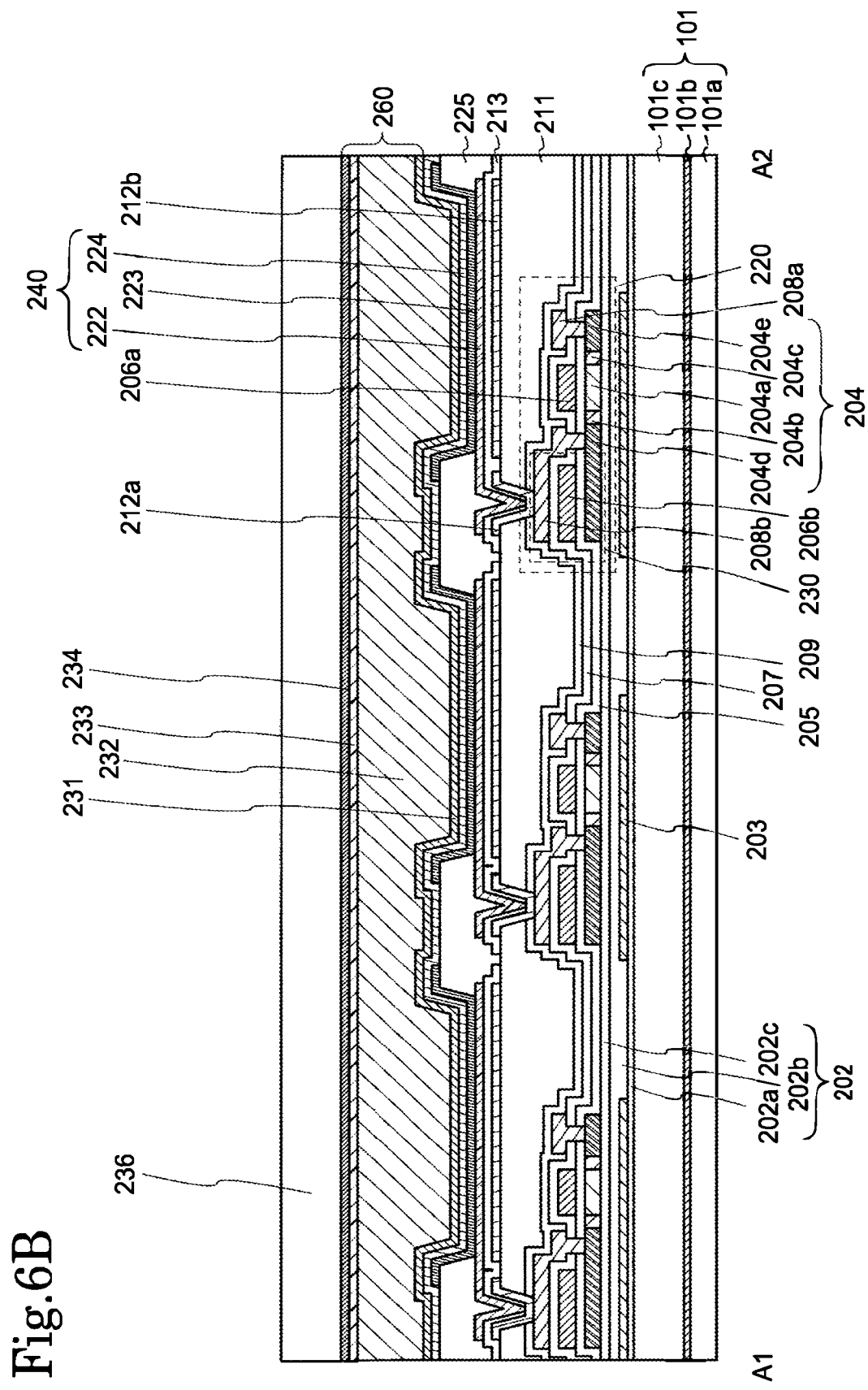
FIG. 6B is a cross-sectional view illustrating a manufacturing method of a display device according to an embodiment of the present invention.

Referring to FIG. 6A and FIG. 6B, a manufacturing method of the display device 100 according to an embodiment of the present invention is described.

FIG. 6A is a cross-sectional view illustrating the manufacturing method of the display device 100 according to an embodiment of the present invention. Since the steps of manufacturing from the substrate 101 to the counter electrode 224 which is included in the light-emitting element 240 are formed using general manufacturing processes of the transistor and the light-emitting element, the description of these manufacturing methods is omitted.

The sealing film 260 is formed on the counter electrode 224 of the light emitting element 240. First, the first nitride insulating layer 231 is formed as the sealing film 260. Then, the first organic insulating layer 232 is formed on the first nitride insulating layer 231. The first nitride insulating layer 231 can be formed by a sputtering method, a CVD method, or the like. The first organic insulating layer 232 can be formed by a dip coating method, a spin coating method, a spray coating method, an inkjet method, or the like.

Next, the second nitride insulating layer 233 is formed on the first organic insulating layer 232. Then, the third nitride insulating layer 234 is formed on the second nitride insulating layer 233. The second nitride insulating layer 233 and the third nitride insulating layer 234 can be formed by a sputtering method, a CVD method, or the like.

FIG. 6B is a cross-sectional view illustrating a step of forming the second organic insulating layer 236 on the third nitride insulating layer 234.

When the nitride insulating layer is contact with a strongly acidic organic resin, the generation of the ammonium ions as shown in FIG. 4A to FIG. 4E is promoted. Therefore, the material of the second organic insulating layer 236 on the third nitride insulating layer 234 is preferably a weakly acidic organic material. A pH of the second organic insulating layer 236 can be controlled by, for example, an amount of an initiator for curing the resin.

The film thickness of the second organic insulating layer 236 is preferably 10 nm or more and 20 μm or less. When the film thickness of the second organic insulating layer 236 is less than 10 μm, scratches may not be prevented in the subsequent steps. On the other hand, when the film thickness of the second organic insulating layer 236 exceeds 20 μm, a convex insulating layer called a dam which is formed at an end portion of the substrate 101 may not be able to dam the flow of the coated second organic insulating layer 236. Further, since there is a limit to the height of the convex insulating layer which can be formed, it is difficult to form a convex insulating layer having the film thickness of over 20 μm. Furthermore, when the second organic insulating layer 236 is a thick film, an amount of the coated resin increases, and thus display defects (streaks, etc.) due to curing defects may occur. In addition, if the resin overflows from the convex insulating layer, a bending defect on the terminal side or a cutting defect when the substrate 101 is divided into individual display devices.

Next, although not shown, the first nitride insulating layer 231 and the second nitride insulating layer 233 are etched using the second organic insulating layer 236 as a mask. In the second region 110 of the substrate 101, thereby, the first nitride insulating layer 231, the second nitride insulating layer 233, and the third nitride insulating layer 234 can be removed to expose the terminal 107.

Finally, the polarizing plate 102 is attached onto the second organic insulating layer 236, whereby the display device 100 as shown in FIG. 1 and FIG. 3 can be manufactured.

[Structure of Second Region]

Figure 8:
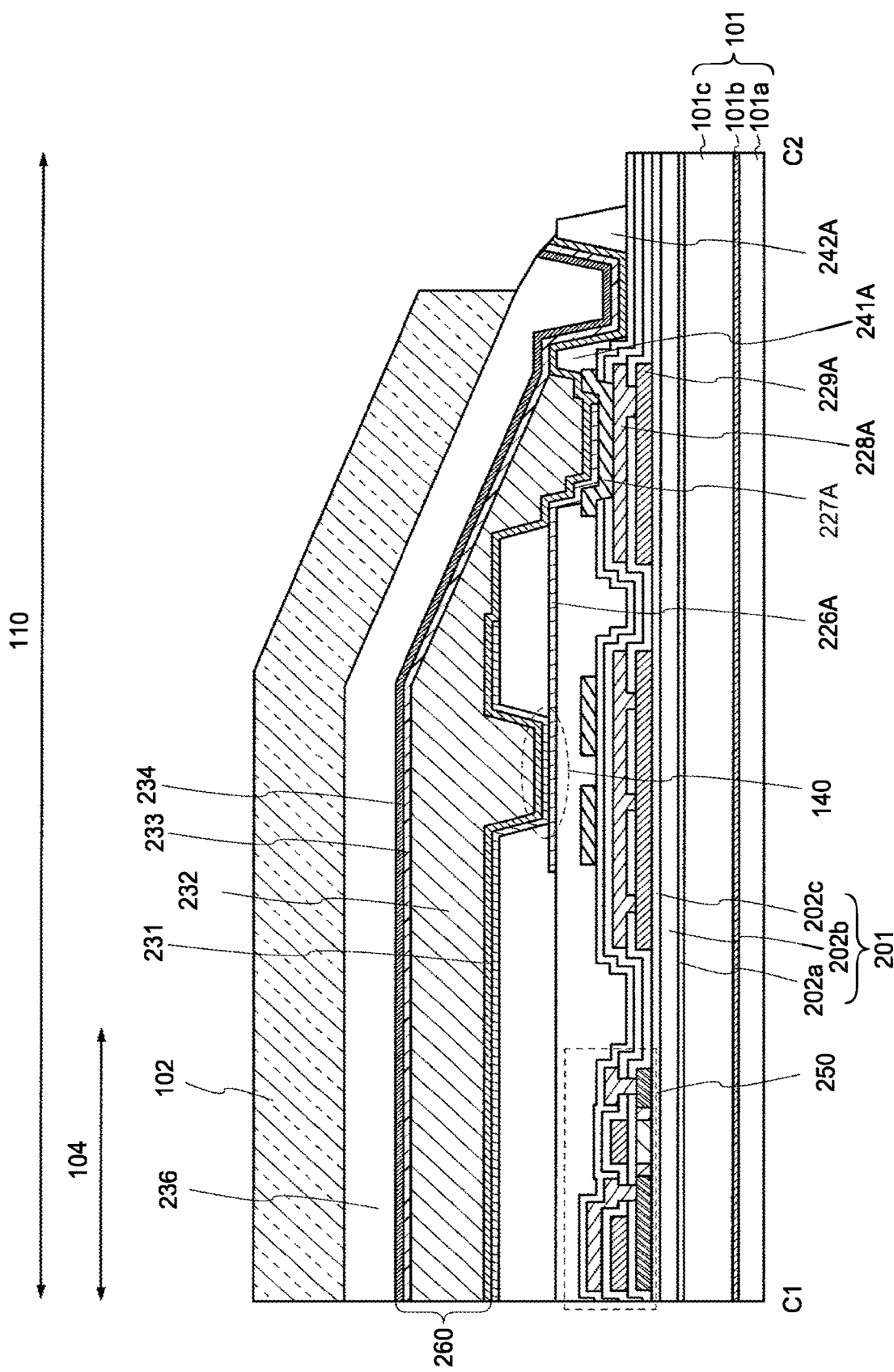
FIG. 8 is a cross-sectional view taken along a line C1-C2 of a display device according to an embodiment of the present invention.
Figure 9:
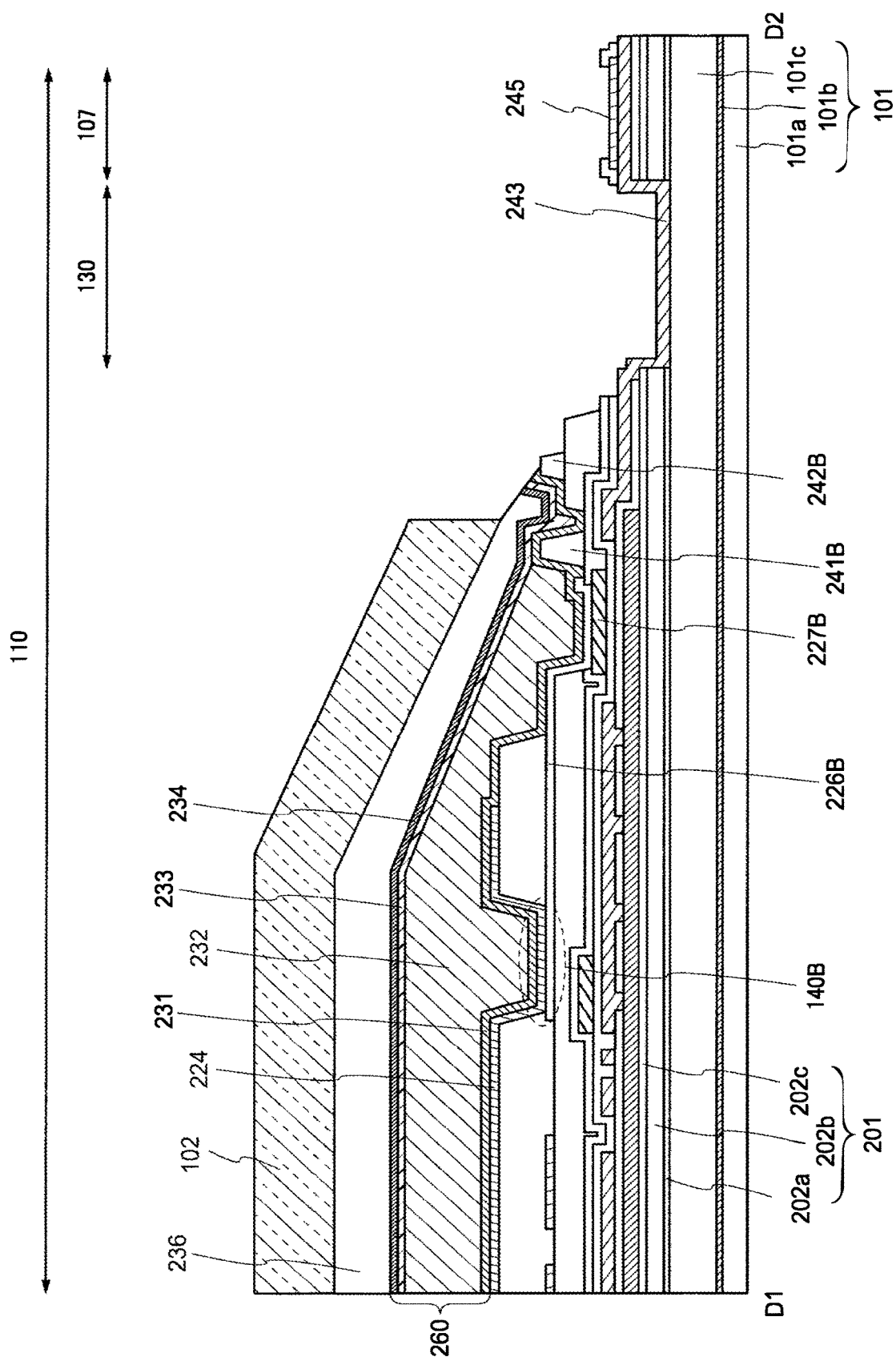
FIG. 9 is a cross-sectional view taken along a line D1-D2 of a display device according to an embodiment of the present invention.

Referring to FIG. 7 to FIG. 9, a cross-sectional structure in the second region of the display device 100 is described.

FIG. 7 is a cross-sectional view of the display device 100 taken along line B1-B2 as shown in FIG. 1. An upper portion of the second region 110 of the substrate 101 as shown in FIG. 7 is a region where various wirings are provided. As shown in FIG. 7, a cathode contact 140 where the counter electrode 224 of the light emitting device 240 is connected to a transparent conductive film 226 is provided in the second region 110. The transparent conductive film 226 is electrically connected to a conductive layer 227, a conductive layer 228, and a wiring layer 229. That is, the counter electrode 224 is electrically connected to any of the plurality of terminals 107 through the wiring layer 229.

Insulating layers 241 and 242 formed in a convex shape, which is called the dam, are provided at an end portion of the substrate 101. The first organic insulating layer 232 is dammed by the insulating layer 241. The first nitride insulating layer 231, the second nitride insulating layer 233, the third nitride insulating layer 234, and the second organic insulating layer 236 are provided to extend to the insulating layer 242. The first nitride insulating layer 231, the second nitride insulating layer 233, and the third nitride insulating layer 234 have a region overlapping each other between the insulating layer 241 and the insulating layer 242. By sealing an end portion of the first organic insulating layer 232 with the first nitride insulating layer 231, the second nitride insulating layer 233, and the third nitride insulating layer 234, the external moisture can be prevented from reaching the light emitting element 240 through the first organic insulating layer 232.

The first nitride insulating layer 231, the second nitride insulating layer 233, and the third nitride insulating layer 234 are provided over the insulating layer 242. The first nitride insulating layer 231, the second nitride insulating layer 233, and the third nitride insulating layer 234 are etched and removed using the second organic insulating layer 236 as a mask. Therefore, a side surface of the second organic insulating layer 236 overlaps a side surface of the insulating layer 242 with the first nitride insulating layer 231, the second nitride insulating layer 233, and the third nitride insulating layer 234 interposed therebetween.

FIG. 8 is a cross-sectional view of the display device 100 taken along line C1-C2 as shown in FIG. 1. The second region 110 of the substrate 101 as shown in FIG. 8 is a region where the scanning line driving circuit 104 is provided. As shown in FIG. 8, a transistor 250 is provided in the scanning line driver circuit 104. The transistor 250 may have a structure similar to or different from the transistors 210 and 220 provided in the pixel 109. In addition, the light-blocking layer 203 may not be provided in the scan line driver circuit 104.

Further, in a region between the scanning line driving circuit 104 and the end portion of the substrate 101, a cathode contact 140A where the counter electrode 224 is connected to a transparent conductive film 226A is provided. The transparent conductive film 226A is electrically connected to a conductive layer 227A, a conductive layer 228A, and a wiring layer 229A. That is, the counter electrode 224 is electrically connected to any of the plurality of terminals 107 through the wiring layer 229A.

The first nitride insulating layer 231, the second nitride insulating layer 233, and the third nitride insulating layer 234 are provided over the insulating layer 242A. The first nitride insulating layer 231, the second nitride insulating layer 233, and the third nitride insulating layer 234 are etched and removed using the second organic insulating layer 236 as a mask. Therefore, the side surface of the second organic insulating layer 236 overlaps a side surface of the insulating layer 242A with the first nitride insulating layer 231, the second nitride insulating layer 233, and the third nitride insulating layer 234 interposed therebetween.

FIG. 9 is a cross-sectional view of the display device 100 taken along line D1-D2 as shown in FIG. 1. The second region 110 of the substrate 101 as shown in FIG. 9 includes the bent region 130 and the plurality of terminals 107.

A cathode contact 140B where the counter electrode 224 of the light emitting element 240 is connected to transparent conductive film 226 is provided. A wiring layer 243 is a lead wiring. The wiring layer 243 extends in the second region 110 and is exposed around an end portion of the substrate 101. A region in contact with the wiring layer 243 and the transparent conductive film 245 becomes the terminal 107.

As the substrate 101 is bent, particularly since the inorganic insulating layer has poor toughness, and easily cracks, the inorganic insulating layer is removed in the bent region 130. In order to secure the strength of this region, a resin layer or the like may be further provided over the wiring layer 244 so as to cover the bent region 130.

The first nitride insulating layer 231, the second nitride insulating layer 233, and the third nitride insulating layer 234 are provided over the insulating layer 242B. The first nitride insulating layer 231, the second nitride insulating layer 233, and the third nitride insulating layer 234 are etched and removed using the second organic insulating layer 236 as a mask. As a result, the first nitride insulating layer 231, the second nitride insulating layer 233, and the third nitride insulating layer 234 in the bent region 130 and the terminal 107 are removed. Therefore, the side surface of the second organic insulating layer 236 overlaps a side surface of the insulating layer 242B with the first nitride insulating layer 231, the second nitride insulating layer 233, and the third nitride insulating layer 234 interposed therebetween.

As described with reference to FIG. 7 to FIG. 9, the first nitride insulating layer 231 and the second nitride insulating layer 233 are in contact with each other over the insulating layer 241 which is in the convex shape functioning as the dam, and the first organic insulating layer is sealed by the first nitride insulating layer 231, the second nitride insulating layer 233, and the third insulating layer 234. Therefore, it is possible to reduce the entry of the moisture into the first organic insulating layer 232.

[Modification of Structure of Second Region]

Figure 10:
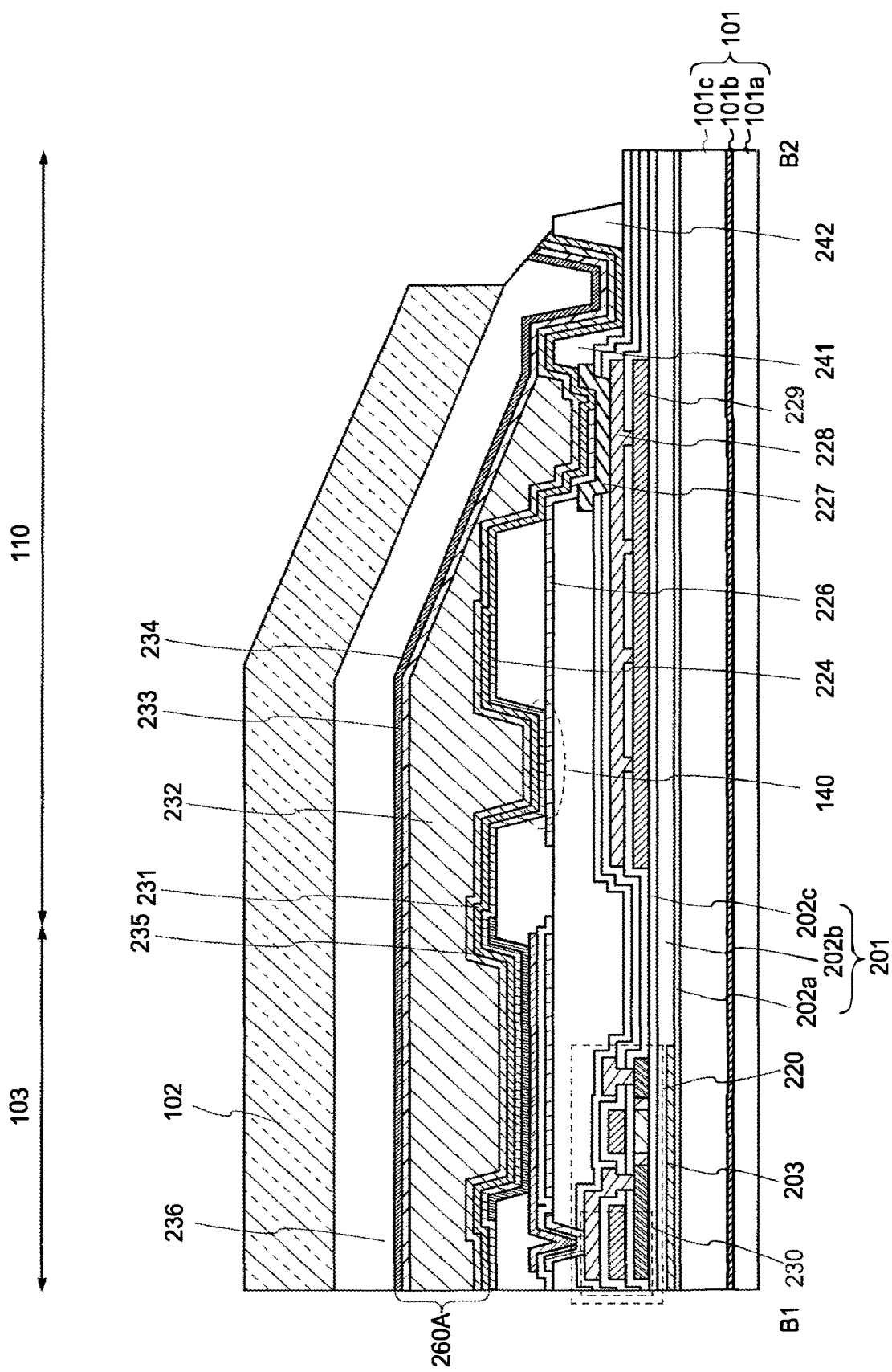
FIG. 10 is a cross-sectional view of a second region of a display device according to an embodiment of the present invention.

Referring to FIG. 10, a modification of the display device 100 according to an embodiment of the present invention is described. FIG. 10 is a cross-sectional view of the second region 110 of the display device 100 according to an embodiment of the present invention. Specifically, FIG. 10 is the cross-sectional view of the second region 110 of the display device 100 including the sealing film 260A as shown in FIG. 5.

The insulating layers 241 and 242 formed in the convex shape, which is called the dam, are provided at the end portion of the substrate 101. The first organic insulating layer 232 is dammed by the insulating layer 241. The first nitride insulating layer 231, the fourth nitride insulating layer 235, the second nitride insulating layer 233, the third nitride insulating layer 234, and the second organic insulating layer 236 are provided to extend to the insulating layer 242. The first nitride insulating layer 231, the fourth nitride insulating layer 235, the second nitride insulating layer 233, and the third nitride insulating layer 234 have a region overlapping each other between the insulating layer 241 and the insulating layer 242. By sealing the end portion of the first organic insulating layer 232 with the first nitride insulating layer 231, the fourth nitride insulating layer 235, the second nitride insulating layer 233, and the third nitride insulating layer 234, the external moisture can be prevented from reaching the light emitting element 240 through the first organic insulating layer 232.

The first nitride insulating layer 231, the fourth nitride insulating layer 235, the second nitride insulating layer 233, and the third nitride insulating layer 234 are provided over the insulating layer 242 which is in the convex shape. The first nitride insulating layer 231, the fourth insulating layer 235, the second nitride insulating layer 233, and the third nitride insulating layer 234 are etched and removed using the second organic insulating layer 236 as a mask. Therefore, the side surface of the second organic insulating layer 236 overlaps the side surface of the insulating layer 242 with the first nitride insulating layer 231, the fourth nitride insulating layer 235, the second nitride insulating layer 233, and the third nitride insulating layer interposed therebetween.

In the second region 110, the fourth nitride insulating layer 235 is in contact with the second nitride insulating layer 233. Therefore, by appropriately selecting the material of the fourth nitride insulating layer 235, the adhesion to the second nitride insulating layer 233 can be improved. In particular, by using a nitride to which oxygen is added as the material of the fourth nitride insulating layer 235, the adhesion of the fourth nitride insulating layer 235 to the second nitride insulating layer 233 is improved.

As described above, in the modification of the display device 100 according to an embodiment of the present invention, the adhesion of the first organic insulating layer in contact with the fourth nitride insulating layer 235 and the second nitride insulating layer 233 is improved. Therefore, it is possible to further reduce the entry of the moisture into the first organic insulating layer 232.

Second Embodiment

Referring to FIG. 11 to FIG. 14, another example of a structure of the display device 100 according to an embodiment of the present invention is described. In this embodiment, a display device 100A in which a touch sensor 120 is provided over the sealing film 260 is described.

Figure 11:
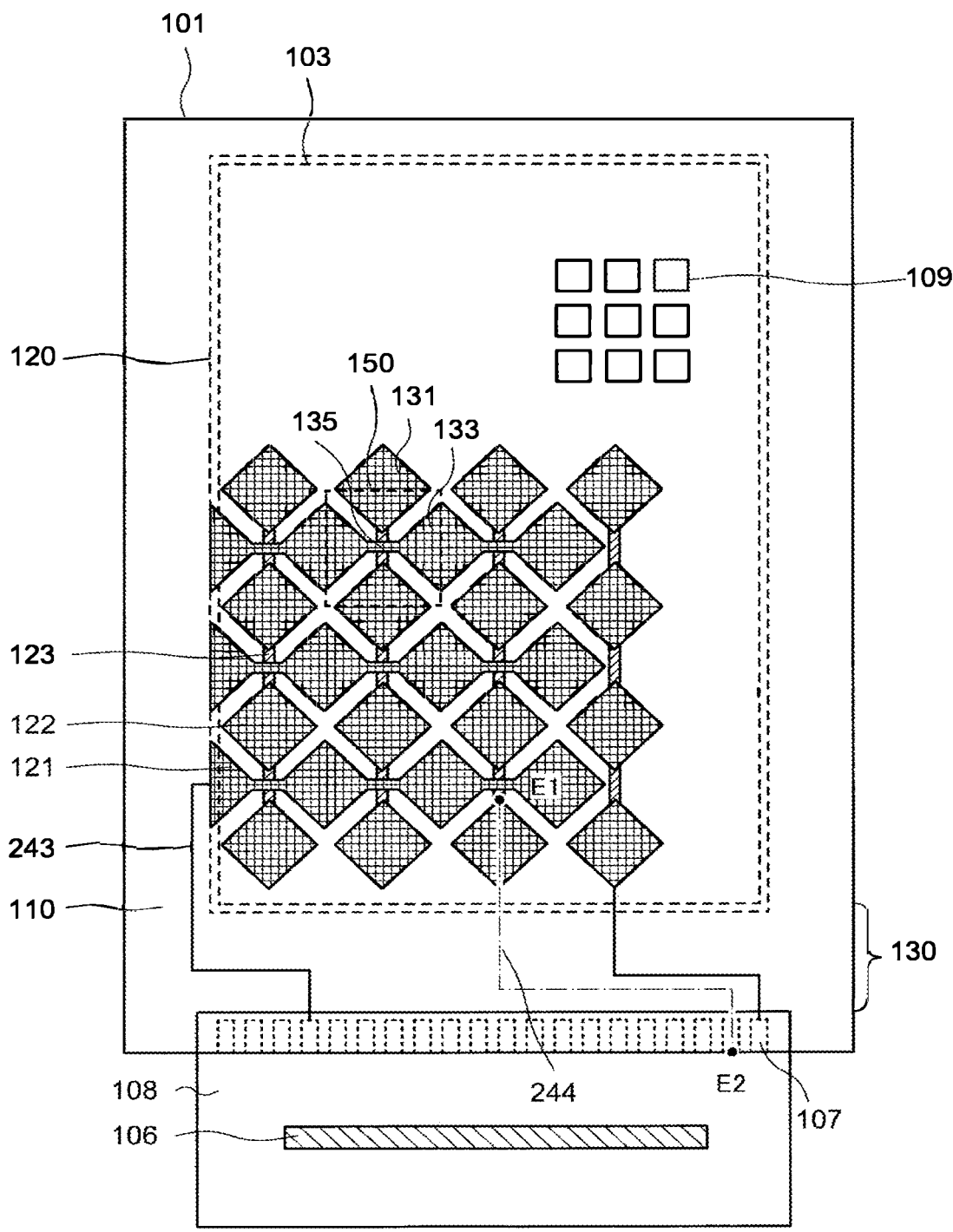
FIG. 11 is a schematic diagram illustrating a structure of a display device according to an embodiment of the present invention.

FIG. 11 is a planar view of the display device 100A according to an embodiment of the present invention. Apart from the touch sensor 120 being provided so as to overlap the first region 103 which is provided over the substrate 101, and the scanning line drive circuit 104 and the polarizing plate 102 not being shown in the planar view, the structure of the display device 100A shown in FIG. 11 is the same as that of the display device 100 as shown in FIG. 1.

The touch sensor 120 includes a plurality of sensor electrodes 121 arranged in a stripe shape in a row direction and a plurality of sensor electrodes 122 arranged in a stripe shape in a column direction. One of the sensor electrodes 121 and the sensor electrode 122 is also called a transmission electrode (Tx), and the other is also called a reception electrode (Rx). Each sensor electrode 121 and each sensor electrode 122 are separated from each other, and a capacitance is formed between them. For example, the capacitance changes when a human finger or the like touches the display region 103 via the sensor electrode 121 and the sensor electrode 122 (hereinafter, referred to as a touch), and the position of the touch is determined by reading this change. In this way, the sensor electrode 121 and the sensor electrode 122 form a so-called projection capacitive touch sensor 120.

The sensor electrode 122 is electrically connected to a wiring layer 243 which is arranged in the second region 110. The terminal 107 is connected to the flexible printed circuit substrate 108, and a touch sensor signal is applied from the driver IC 106 to the sensor electrode 122 through the terminal 107. Furthermore, the wiring layer 243 may also be provided in a region which overlaps the scanning line driver circuit 104.

Similarly, the sensor electrode 121 is electrically connected to the wiring layer 244 which is arranged in the second region 110. The terminal 107 is connected to the flexible printed circuit substrate 108, and a touch sensor signal is applied from the driver IC 106 to the sensor electrode 122 via the terminal 107.

In the touch sensor 120, the sensor electrode 121 includes a plurality of conductive layers 131 which have a substantially square shape, and a connection electrode 123, and the sensor electrode 122 includes a plurality of conductive layers which have a substantially square shape, and a connection region 135. In addition, the sensor electrode 121 and the sensor electrode 122 are electrically independent and separated from each other.

Figure 12:
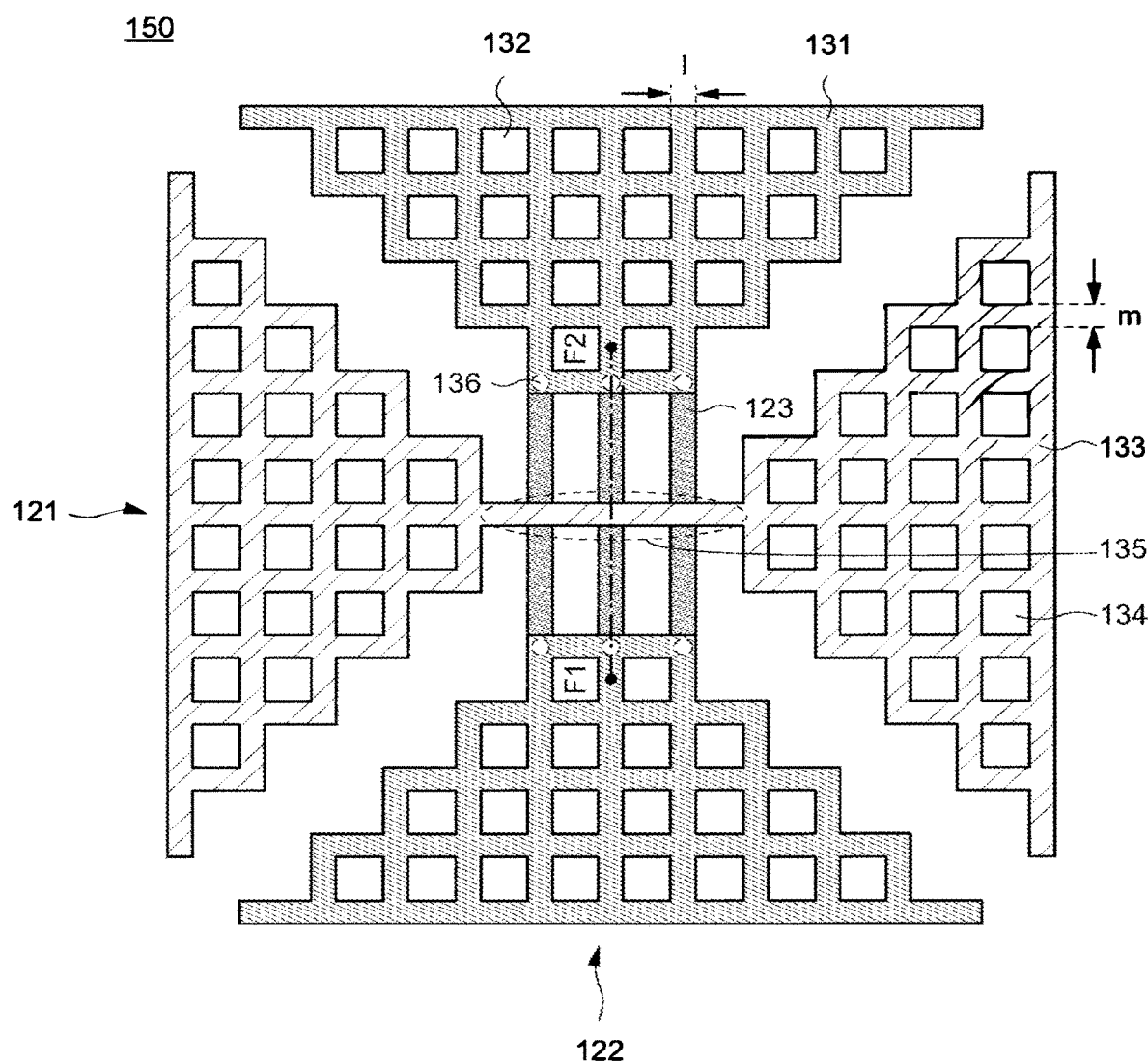
FIG. 12 is an enlarged view of a part of the display device as shown in FIG. 11.

FIG. 12 is an enlarged view of a region 150 in the display device 100A as shown in FIG. 11. Although different hatchings are shown in FIG. 12 in order to distinguish the sensor electrode 121 and the sensor electrode 122, the sensor electrode 121 and the sensor electrode 122 are formed from the same conductive layer. In the sensor electrode 121, conductive layers 133 which are adjacent left and right are connected via a connection region 135. In the sensor electrode 122, conductive layers 131 which are adjacent up and down are connected via the connection electrode 123. The sensor electrode 121 includes a plurality of conductive layers 133 and a plurality of openings 134, and the sensor electrode 122 includes a plurality of conductive layers 131 and a plurality of openings 132.

In each of the conductive layers 131 and the conductive layers 133, the plurality of openings 132 and the plurality of openings 134 are arranged in a matrix. In this way, the conductive layer 131 and the conductive layer 133 have a mesh shape. Here, a width 1 of wiring which forms the conductive layer 131 is 1 µm or more and 10 µm or less, or 2 µm or more and 8 µm or less and typically 5 µm. Similarly, a width m of wiring which forms the conductive layer 133 is 1 µm or more and 10 µm or less, or 2 µm or more and 8 µm or less and typically 5 µm.

As shown in FIG. 12, the connection region 135 which connects left and right conductive layers 133 is arranged along a first direction, and the connection electrode 123 which connects up and down conductive layers 131 is arranged in a second direction which intersects the first direction. In other words, the connection electrode 123 has a region which intersects a part of the sensor electrode 121. Furthermore, although the width of the connection electrode 123 is shown as the same width as the width 1 of the conductive layer 131 in FIG. 10, it may also be greater than the width 1 of the conductive layer 131. The connection electrode 123 is preferred not to overlap the light emitting region of the light emitting element 240 of the pixel 109.

Figure 13:
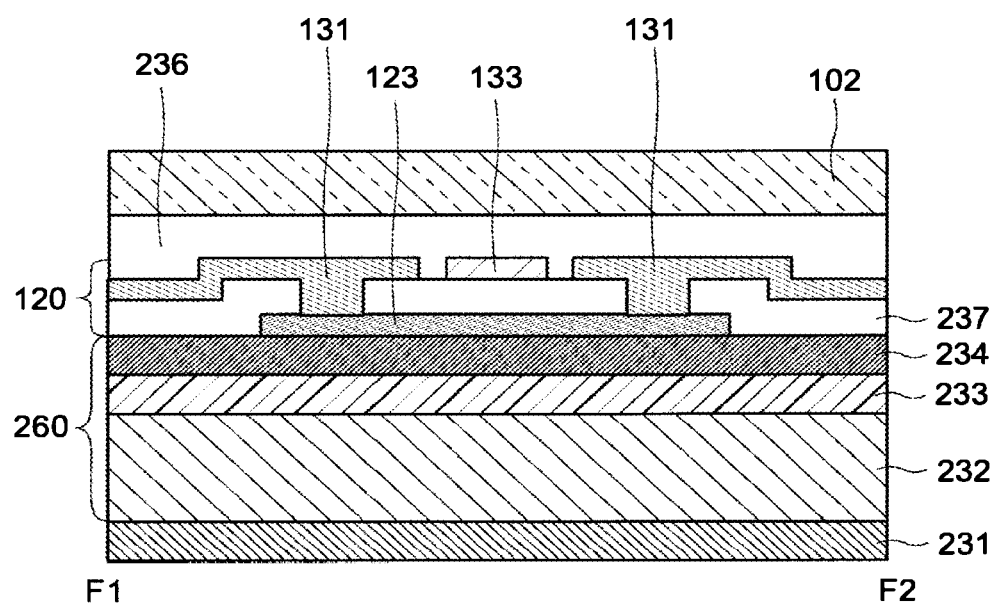
FIG. 13 is a cross-sectional view of the display device taken along a line F1-F2 as shown in FIG. 12.

FIG. 13 is a cross-sectional view of the touch sensor 120 taken along a line F1-F2 as shown in FIG. 12. Further, an illustration of the structure below the first inorganic insulating layer 231 is omitted in FIG. 13. As shown in FIG. 13, a fifth nitride insulating layer 237 is arranged under the sensor electrode 121 and the sensor electrode 122 in order to prevent the sensor electrode 121 and the sensor electrode 122 from contacting each other. Next, the connection electrode 123 for connecting conductive layers 131 adjacent up and down over and below the sensor electrode 122 is arranged via the fifth nitride insulating layer 237. In this way, it is possible to prevent the sensor electrode 121 and the sensor electrode 122 from contacting each other in the region where the sensor electrode 121 and the sensor electrode 122 intersect.

The fifth nitride insulating layer 237 is in contact with the second organic insulating layer 236. By using the same material as the material of the first nitride insulating layer 231 or the second nitride insulating layer 233 as a material of the fifth nitride insulating layer 237, the fifth nitride insulating layer 237 can improve the adhesion with the second organic insulating layer 236. For example, silicon nitride, silicon nitride oxide, aluminum nitride, aluminum nitride oxide, or the like can be used as a material of the fifth nitride insulating layer 237.

Figure 14:
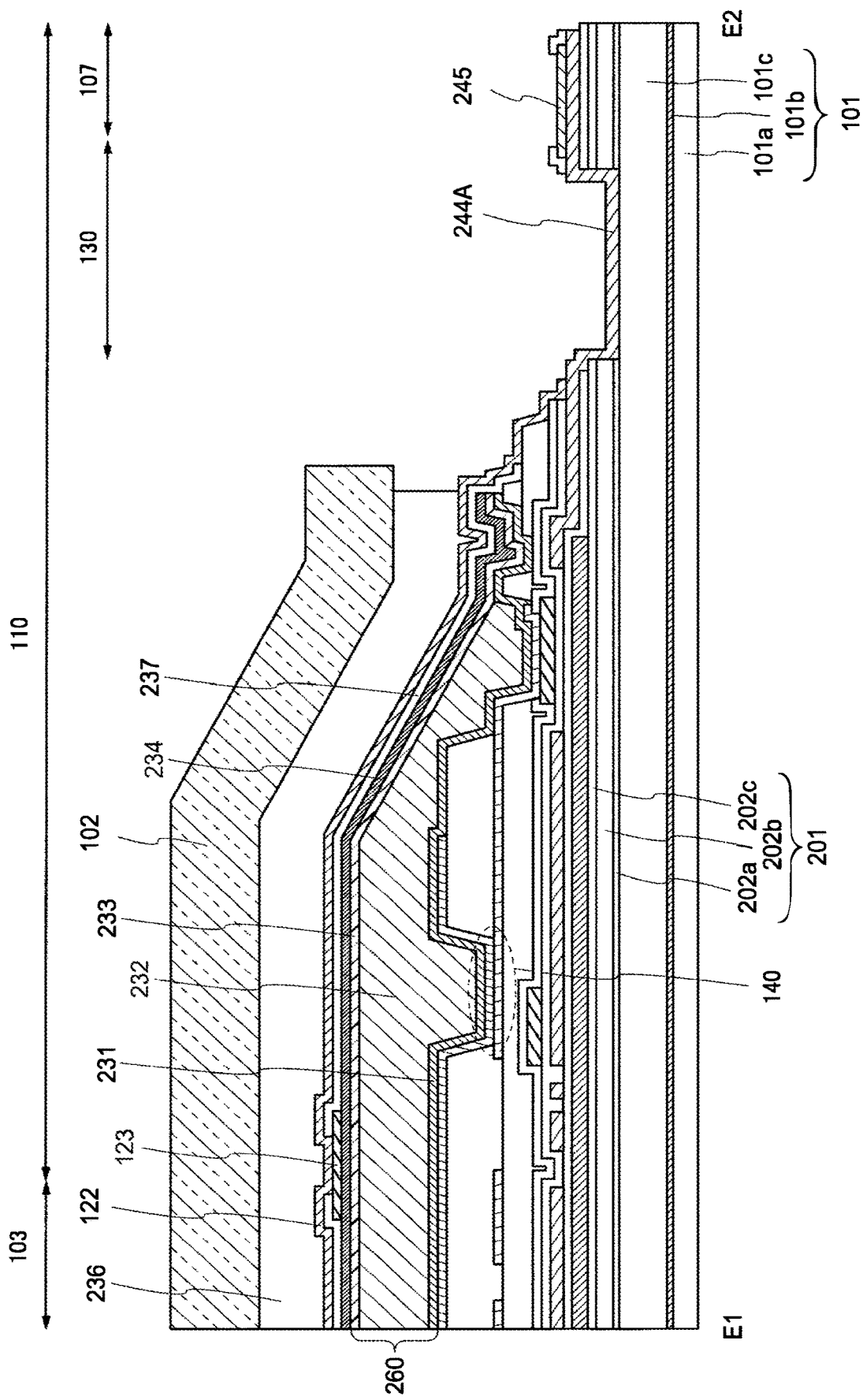
FIG. 14 is a cross-sectional view of the display device taken along a line E1-E2 as shown in FIG. 11.

FIG. 14 is a cross-sectional view of the display device 100A taken along a line E1-E2 as shown in FIG. 11. Specifically, FIG. 14 shows a connection region between the sensor electrode 122 and the connection electrode 123. The structure from the substrate 101 to the sealing film 260 is the same as that in FIG. 1. In this embodiment, the touch sensor 120 is provided over the third nitride insulating layer 234 of the sealing film 260. The connection electrode 123 is provided on the third nitride insulation layer 234, the second organic insulating layer 236 is provided over the connection electrode 123, and the sensor electrode 122 is provided on the second organic insulation layer 236. A wiring layer 244A extends in the second region 110 and is exposed around the end portion of the second region 110. A region in contact with the wiring layer 244A and the transparent conductive film 245 becomes the terminal 107.

In the display device 100A, the fifth nitride insulating layer 237 covers the respective end portions of the first nitride insulating layer 231, the second nitride insulating layer 233, and the third nitride insulating layer 234. Therefore, the moisture can be prevented from entering the first nitride insulating layer 231, the second nitride insulating layer 233, and the third nitride insulating layer 234.

The fifth nitride insulating layer 237 is in contact with the third nitride insulating layer 234. Further, in the display device 100A, the fifth nitride insulating layer 237 is provided on the outermost side of the plurality of nitride insulating layers. The fifth nitride insulating layer 237 preferably has a property equal to or higher than that of the third nitride insulating layer 234. Therefore, an absolute value of a stress of the fifth nitride insulating layer 237 is preferably equal to or more than the absolute value of the stress of the third nitride insulating layer 234. A water vapor permeability of the fifth nitride insulating layer 237 is preferably equal to or lower than the water vapor permeability of the third nitride insulating layer 234. Further, it is preferable that an N—H bond ratio of the fifth nitride insulating layer 237 be less than or equal to the N—H bond ratio of the third nitride insulating layer 234.

According to the display devices 100 and 100A according to an embodiment of the present invention, since the sealing films 260 and 260A include a plurality of nitride insulating layers having not only a water vapor permeability but also the improved adhesion at the interface, the moisture can be prevented from entering and the generation of ammonium ions in the nitride insulating layers can be suppressed. Therefore, the reliability of the light emitting element 240 is improved and defects of the polarizing plate 102 are reduced. As a result, the reliability of the display devices 100 and 100A can be improved.

Examples

Hereinafter, examples and comparative examples are described in order to explain the nitride insulating layer applied to the display device according to one embodiment of the present invention are described in more detail. The present invention is not limited to the example below.

Example

An epoxy resin having a film thickness of 10 μm was coated on a silicon nitride layer which was formed on a glass substrate. A silicon nitride layer 1 of 500 μm as a second nitride insulating layer and a silicon nitride layer 2 of 500 μm as a third nitride insulating layer were sequentially formed on the epoxy resin. That is, in (Example), a sample of glass/silicon nitride layer (1 μm)/epoxy resin (10 μm)/silicon nitride layer 1 (500 nm)/silicon nitride layer 2 (500 nm) was obtained. Although the epoxy resin was formed in (Example), an acrylic resin may be used instead of the epoxy resin.

The silicon nitride layer 1 was formed by the CVD method at a gas flow ratio of $SiH_4:NH_3:N_2:H_2=1.1:1:16.2:9.2$. The power efficiency was RF Power $[W]/(SiH_4+NH_3)$ [sccm]=2.2. Further, the $NH_3$ flow ratio of $(NH_3)/(SiH_4+NH_3+N_2+H_2)\times100[\%]$ was set to 3.6 during the CVD film formation.

The silicon nitride layer 2 was formed by the CVD method at a gas flow ratio of $SiH_4:NH_3:N_2:H_2=2:1:36:4$. In the formation of the silicon nitride layer 2, the film formation conditions of lower pressure and narrower interelectrode gap than those of the silicon nitride layer 1 were applied. Specifically, the pressure and the interelectrode gap of the film formation conditions of the silicon nitride layer 2 were set to 4/5 and 33/37 of those of the silicon nitride layer 1, respectively. The power efficiency was RF Power $[W]/(SiH_4+NH_3)$ [sccm]=3.2. Further, the $NH_3$ flow ratio of $(NH_3)/(SiH_4+NH_3+N_2+H_2)\times100[\%]$ was set to 2.3 during the CVD film formation.

Comparative Example

An epoxy resin having a film thickness of 10 μm was coated on a silicon nitride layer which was formed on a glass substrate. A silicon nitride layer 1 of 500 μm as a second nitride insulating layer and a silicon nitride layer 2 of 500 μm as a third nitride insulating layer were sequentially formed on the epoxy resin. That is, in (Comparative Example), a sample of glass/silicon nitride layer (1 μm)/epoxy resin (10 μm)/silicon nitride layer 1 (500 nm)/silicon nitride layer 2 (500 nm) was obtained. Although the epoxy resin was formed in (Comparative Example), an acrylic resin may be used instead of the epoxy resin.

(Evaluation)

First, each of the silicon nitride layer 1 and the silicon nitride layer 2 were evaluated as a single layer.

The film density of the silicon nitride layer 1 obtained by the Rutherford backscattering analysis (RBS) and the elastic recoil detection analysis (ERDA) was 1.9 (g/cm$^3$). On the other hand, the film density of the silicon nitride layer 2 obtained by the RBS and the ERDA was 2.1 (g/cm$^3$).

The wet etching rates of the silicon nitride layer 1 and the silicon nitride layer 2 were 10.34 (nm/sec) and 6.8 (nm/sec), respectively.

The result of the FT-IR measurement of the silicon nitride layer 1 was Si—N:70, Si—H:17.2, and N—H:12.8. That is, the N—H bond ratio of the silicon nitride layer 1 was 12.8(%). On the other hand, the result of the FT-IR measurement of the silicon nitride layer 2 was Si—N:86.1, Si—H:10.6, and N—H:3.36. That is, the N—H bond ratio of the silicon nitride layer 2 was 3.36(%).

The scratch test using the nano indenter was performed using the samples of (Example) and (Comparative Example). As the evaluation of the scratch test, the relative ratio of the vertical load (=vertical load other than the silicon nitride layer 1/vertical load of the silicon nitride layer 1) was used. The relative ratio of vertical load for the sample of (Example) was calculated to be 1.15. On the other hand, the relative ratio of the vertical load of the sample of (Comparative Example) was calculated to be 1. Therefore, it was confirmed that the sample of (Example) had better the adhesion than the sample of (Comparative Example).

When the samples of (Example) and (Comparative Example) were observed by the cross-section SEM, it was confirmed that the sample of (Comparative Example) peeled off at the interface between the epoxy resin and the silicon nitride layer 1. On the other hand, it was not confirmed that the sample of (Example) peeled at the interface.

From the above results, it was confirm that the wet etching rate of the silicon nitride layer 1 (corresponding to the second nitride insulating layer) on the epoxy resin (corresponding to the first organic insulating layer) is lower than that of the silicon nitride layer 1 and the stacked structure of the silicon nitride 1 and the silicon nitride layer 2 (corresponding to the third nitride insulating layer) which has a large N—H bond ratio improves the adhesion of the interface between the first organic insulating layer and the second nitride insulating layer.

What is claimed is:

1. An electronic device comprising:
    a first region comprising:
        an organic layer in a light emitting element;
        a plurality of nitride layers over the organic layer; and
        a first organic insulating layer over the organic layer; and
    a second region outside the first region,
    wherein the second region comprises a portion in which the plurality of nitride layers are provided and the organic layer and the first organic insulating layer are not provided,
    wherein the plurality of nitride layers comprises a first nitride layer, a second nitride layer, a third nitride layer, and a fourth nitride layer,
    wherein the first nitride layer is between the organic layer and the first organic insulating layer in the first region,
    wherein the second nitride layer and the third nitride layer are over the first nitride layer,
    wherein the fourth nitride layer is between the first nitride layer and the first organic insulating layer,
    wherein the second nitride layer is in contact with the first organic insulating layer in the first region,
    wherein the fourth nitride layer is in contact with the first organic insulating layer in the first region,
    wherein the fourth nitride layer is between the first nitride layer and the second nitride layer in the second region, and
    wherein the fourth nitride layer is in contact with the second nitride layer in the portion of the second region.

2. The electronic device according to claim 1,
    wherein the third nitride layer is over the second nitride layer, and
    wherein the first organic insulating layer is between the first nitride layer and the second nitride layer.

3. The electronic device according to claim 1, wherein the first nitride layer is in contact with the first organic insulating layer.

4. The electronic device according to claim 1, wherein the second nitride layer is between the first nitride layer and the third nitride layer in the second region.

5. The electronic device according to claim 1, wherein an absolute value of a stress of the second nitride layer is greater than or equal to an absolute value of a stress of the first nitride layer and less than an absolute value of a stress of the third nitride layer.

6. The electronic device according to claim 1, a ratio of a film thickness of the second nitride layer to a film thickness of the third nitride layer is greater than or equal to 0.11 and less than or equal to 1.0.

* * * * *